United States Patent
Lyalin et al.

(10) Patent No.: US 9,660,606 B2
(45) Date of Patent: May 23, 2017

(54) AUTOTRANSFORMER-BASED IMPEDANCE MATCHING CIRCUITS AND METHODS FOR RADIO-FREQUENCY APPLICATIONS

(71) Applicant: SKYWORKS SOLUTIONS, INC., Woburn, MA (US)

(72) Inventors: Aleksey A. Lyalin, Thousand Oaks, CA (US); Weimin Sun, Santa Rosa Valley, CA (US); Nicholas Quinn Muhlmeyer, North Hills, CA (US); Russ Alan Reisner, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/263,860

(22) Filed: Apr. 28, 2014

(65) Prior Publication Data

US 2014/0320205 A1    Oct. 30, 2014

Related U.S. Application Data

(60) Provisional application No. 61/817,291, filed on Apr. 29, 2013.

(51) Int. Cl.
*H03F 3/191* (2006.01)
*H03H 7/38* (2006.01)
(Continued)

(52) U.S. Cl.
CPC ........... *H03H 7/38* (2013.01); *H01F 27/2804* (2013.01); *H01F 41/02* (2013.01); *H01L 23/66* (2013.01);
(Continued)

(58) Field of Classification Search
CPC .. H03H 7/38; H03H 5/00; H03H 7/42; H02M 5/45; G05F 1/112; H03F 1/00;
(Continued)

(56) References Cited

U.S. PATENT DOCUMENTS 6,664,935 B1 * 12/2003 Thompson ................ H01P 5/02
                                                  333/124
7,706,756 B2 *  4/2010 Sato ........................ H03F 3/195
                                                  333/100
(Continued)

FOREIGN PATENT DOCUMENTS

TW           102115418      4/2014
TW           103115417      4/2014
WO  PCT/US2014/035751      4/2014

OTHER PUBLICATIONS

International Search Report and Written Opinion issued on Sep. 1, 2014 in connection with corresponding PCT Application No. PCT/US2014/035751.
(Continued)

*Primary Examiner* — Steven J Mottola
*Assistant Examiner* — Hafizur Rahman
(74) *Attorney, Agent, or Firm* — Chang & Hale LLP

(57) ABSTRACT

Disclosed are devices and methods related to autotransformer-based impedance matching for radio-frequency (RF) applications. In some embodiments, an impedance matching device can include a primary metal trace and a secondary metal trace, each having a respective number of turns. Such metal traces can be interconnected to form an autotransformer with the primary metal trace and the secondary metal trace being in respective planes separated by a selected distance. Such an autotransformer can be utilized to, for example, facilitate impedance matching of an amplified RF signal from a power amplifier (PA). In some embodiments, the impedance matching device can be implemented as an integrated passive device (IPD) mountable on a packaging substrate. Such an IPD can be configured to allow stacking of another component on the IPD to yield a number of desirable features in products such as RF modules.

19 Claims, 24 Drawing Sheets

(51) Int. Cl.

| | | |
|---|---|---|
| *H01F 27/28* | (2006.01) | |
| *H01F 41/02* | (2006.01) | |
| *H03F 1/56* | (2006.01) | |
| *H03F 3/195* | (2006.01) | |
| *H01L 23/66* | (2006.01) | |
| *H03H 7/01* | (2006.01) | |
| *H03H 1/00* | (2006.01) | |
| *H01F 30/02* | (2006.01) | |
| *H01L 49/02* | (2006.01) | |

(52) U.S. Cl.
CPC ............. *H03F 1/565* (2013.01); *H03F 3/191* (2013.01); *H03F 3/195* (2013.01); *H01F 30/02* (2013.01); *H01F 2027/2809* (2013.01); *H01L 28/10* (2013.01); *H01L 2223/6655* (2013.01); *H01L 2223/6672* (2013.01); *H01L 2224/49171* (2013.01); *H03F 2200/387* (2013.01); *H03F 2200/391* (2013.01); *H03H 7/175* (2013.01); *H03H 7/1758* (2013.01); *H03H 7/1775* (2013.01); *H03H 2001/0064* (2013.01); *H03H 2001/0078* (2013.01); *Y10T 29/4902* (2015.01)

(58) Field of Classification Search
CPC ...... H03F 3/119; H03F 2200/387; H01P 3/08; H01F 29/00; H01F 7/06; H04B 1/117
USPC ...... 330/307, 250, 302; 333/32, 33, 167, 25, 333/26, 177; 343/860; 438/107; 455/78; 336/180, 182, 183, 200, 232
See application file for complete search history.

(56) References Cited

U.S. PATENT DOCUMENTS

| | | | |
|---|---|---|---|
| 8,093,959 | B1 | 1/2012 | Apel |
| 8,349,648 | B2* | 1/2013 | Kim et al. ................... 438/107 |
| 2004/0207504 | A1 | 10/2004 | Yang et al. |
| 2007/0279035 | A1 | 12/2007 | Robotham et al. |
| 2008/0136559 | A1* | 6/2008 | Takahashi ............. H03H 7/465 333/167 |
| 2009/0174477 | A1 | 7/2009 | Lee et al. |
| 2009/0195324 | A1 | 8/2009 | Li et al. |
| 2012/0139640 | A1* | 6/2012 | Calvillo Cortes ...... H01F 19/04 330/295 |
| 2012/0280755 | A1* | 11/2012 | Wright ................... H03F 1/565 330/307 |
| 2013/0069197 | A1* | 3/2013 | Kim ........................ H01L 21/56 257/531 |
| 2013/0307635 | A1* | 11/2013 | Kase et al. .................... 333/112 |
| 2014/0002187 | A1* | 1/2014 | McPartlin ........... H01L 29/7378 330/250 |

OTHER PUBLICATIONS

U.S. Appl. No. 14/263,870, Low Loss Impendance Transforms Implemented as Integrated Passive Devices and Related Methods Thereof, filed Apr. 28, 2014.
International Preliminary Report on Patentability for PCT/US2014035751 dated Nov. 12, 2015.

* cited by examiner

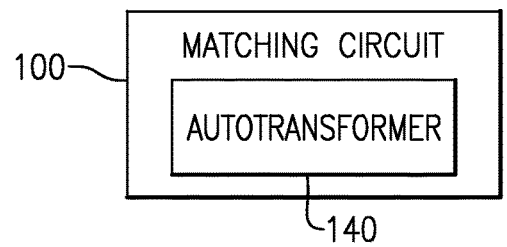
FIG.1
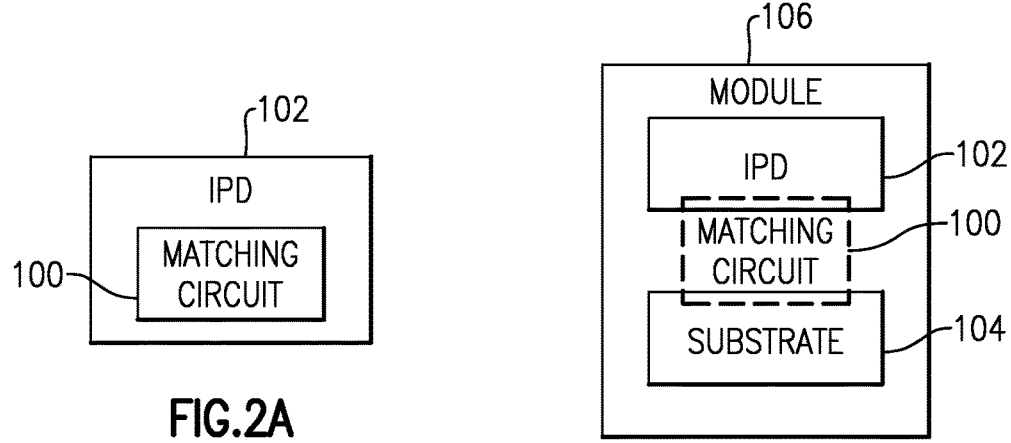
FIG.2A
FIG.2B
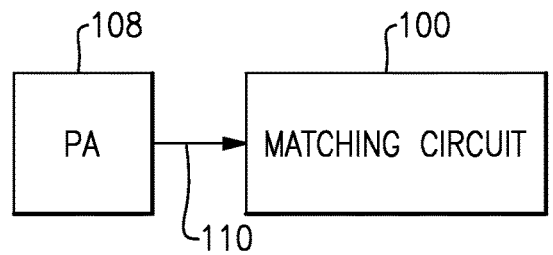
FIG.3 freq (50.00MHz to 10.00GHz)

freq (0.0000Hz to 6.000GHz)

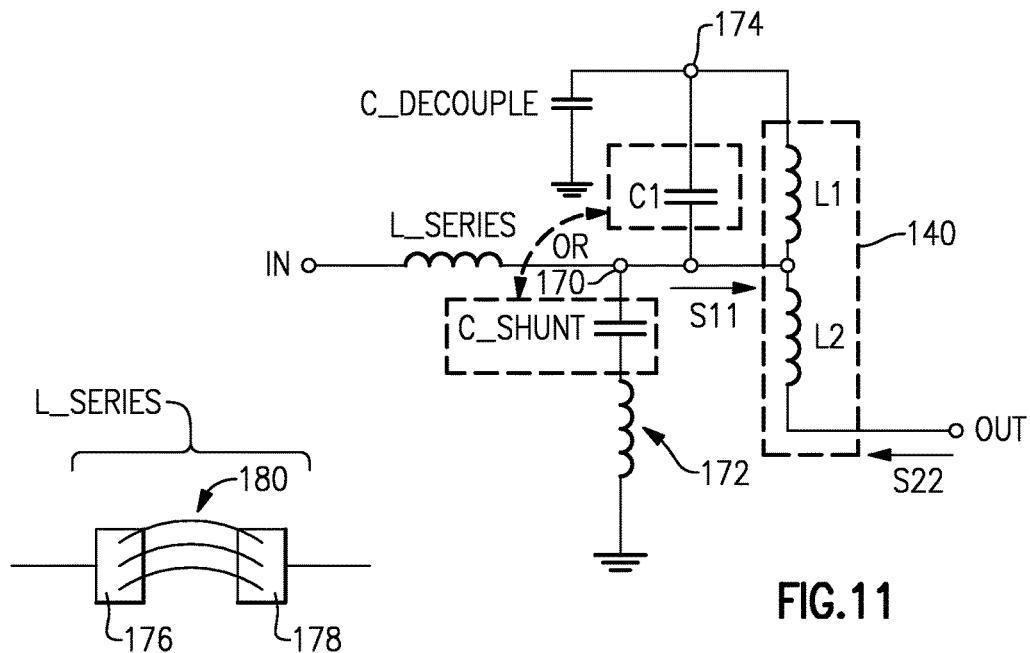
FIG.11
FIG.12
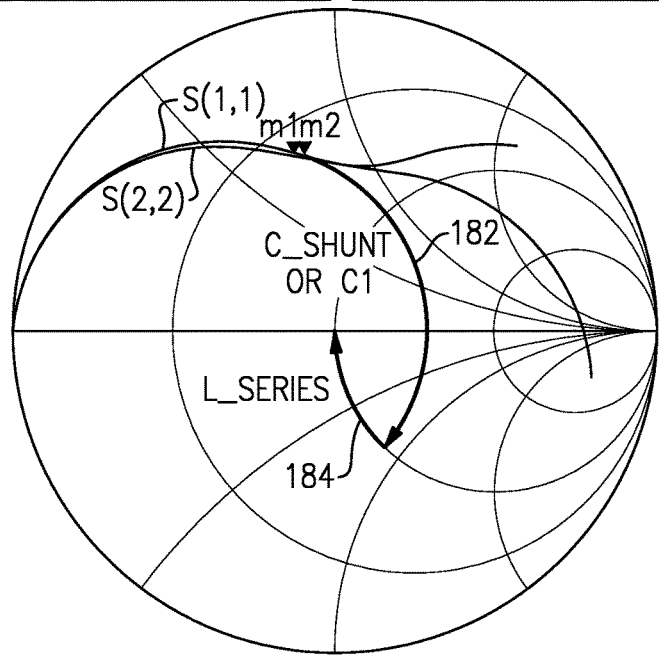
FIG.13

AUTOTRANSFORMER-BASED IMPEDANCE MATCHING CIRCUITS AND METHODS FOR RADIO-FREQUENCY APPLICATIONS

CROSS-REFERENCE TO RELATED APPLICATIONS

This application claims priority to U.S. Provisional Application No. 61/817,291 filed Apr. 29, 2013, entitled DEVICES AND METHODS RELATED TO AUTOTRANSFORMERS FOR RADIO-FREQUENCY MATCHING CIRCUITS, the disclosure of which is hereby expressly incorporated by reference herein in its entirety.

BACKGROUND

Field

The present disclosure generally relates to autotransformer-based impedance matching circuits implemented as integrated passive devices (IPDs).

Description of the Related Art

In radio-frequency (RF) applications, an impedance matching circuit is typically implemented between an output of a power amplifier (PA) and a circuit downstream of the output. Such a downstream circuit can include, for example, a switching circuit, a filter, a duplexer, etc., and be configured to route and/or condition the amplified RF signal for transmission. The impedance matching circuit is typically configured to provide transformation of impedance between the PA and the downstream circuit to thereby reduce loss of the amplified RF signal and to allow transmission of the RF signal in an efficient manner.

SUMMARY

In some implementations, the present disclosure relates to an impedance matching device for a radio-frequency (RF) power amplifier (PA). The impedance matching device includes a primary metal trace having one or more turns between a first end and a second end. The first end of the primary metal trace is configured to be capable of being connected to a voltage source for the PA. The second end of the primary metal trace is configured to be capable of being connected to an output of the PA. The impedance matching device further includes a secondary metal trace having one or more turns between a first end and a second end. The first end of the secondary metal trace is connected to the second end of the primary metal trace. The second end of the secondary metal trace is configured to be capable of being connected to an output node. The primary metal trace and the secondary metal trace are in respective planes separated by a distance.

In some embodiments, the impedance matching device can further include a first substrate configured to support the primary metal trace. In some embodiments, the impedance matching device can further include an insulator layer implemented between the primary metal trace and the secondary metal trace. The insulator layer can have a thickness selected to provide the separation distance. The impedance matching device can further include a conductive feature implemented through the insulator layer. The conductive feature can be configured to provide the connection between the first end of the secondary metal trace and the second end of the primary metal trace.

In some embodiments, the impedance matching device can further include a second substrate configured to support the secondary metal trace. The second substrate with the secondary metal trace can be in a flip-mounted configuration with the first substrate to provide the separation distance between the primary metal trace and the secondary metal trace. Each of the first substrate and the second substrate can include a mounting surface opposite from a surface on which respective metal trace is implemented on. The mounting surface of the first substrate can include a plurality of contact pads configured to allow mounting of the impedance matching device to a packaging substrate. The mounting surface of the second substrate can be configured to allow mounting of a die thereon. The mounting surface of the second substrate can be substantially flat.

In some embodiments, the impedance matching device can be an integrated passive device (IPD). In some embodiments, the primary metal trace can be wider than the secondary metal trace. In some embodiments, the primary metal trace can be thicker than the secondary metal trace. The primary metal trace can be configured to provide passage of a DC current for the PA. The primary metal trace can be further configured to provide a low impedance path for an RF current. The secondary metal trace and its separation distance with the primary metal trace can be configured to provide strong coupling between the primary and secondary metal traces.

In some embodiments, the primary metal trace and the second metal trace can be configured as an autotransformer. The impedance matching device can further include one or more circuit elements configured to provide matching functionality on either or both sides of the autotransformer.

According to a number of implementations, the present disclosure relates to a method for fabricating an impedance matching device. The method includes forming a primary metal trace. The primary metal trace has one or more turns between a first end and a second end, with the first end of the primary metal trace configured to be capable of being connected to a voltage source for a power amplifier (PA), and the second end of the primary metal trace configured to be capable of being connected to an output of the PA. The method further includes implementing a secondary metal trace relative to the primary metal trace. The secondary metal trace has one or more turns between a first end and a second end, with the first end of the secondary metal trace connected to the second end of the primary metal trace, and the second end of the secondary metal trace configured to be capable of being connected to an output node. The primary metal trace and the secondary metal trace are in respective planes separated by a distance.

In a number of teachings, the present disclosure relates to a radio-frequency (RF) module that includes a packaging substrate configured to receive a plurality of components. The RF module further includes a power amplifier (PA) die implemented on the packaging substrate. The PA die includes an output node configured to provide an amplified RF signal. The RF module further includes an impedance matching device implemented on the packaging substrate. The impedance matching device includes a primary metal trace having one or more turns between a first end and a second end. The first end of the primary metal trace is connected to a voltage source for the PA die, and the second end of the primary metal trace is connected to the output node of the PA die. The impedance matching device further includes a secondary metal trace having one or more turns between a first end and a second end. The first end of the secondary metal trace is connected to the second end of the primary metal trace, and the second end of the secondary metal trace is connected to an output node of the impedance matching device. The primary metal trace and the secondary metal trace are in respective planes separated by a distance.

In some embodiments, the impedance matching device can be implemented as an integrated passive device (IPD). The IPD can include a first side and a second side. The first side can be configured to facilitate mounting of the IPD on the packaging substrate, and the second side can be configured to allow mounting of a component to thereby yield a stack configuration between the IPD and the component. The first side can be configured to allow flip-chip mounting of the IPD on the packaging substrate. The second side can include a substantially flat surface suitable for mounting of the component. The component can include a band selection switch device. The stack configuration can allow a reduction in lateral size of the RF module.

In some embodiments, the packaging substrate can include a laminate substrate. The IPD having the first and second metal traces can allow the laminate substrate to have a reduced number of layers.

In some embodiments, the IPD can be positioned adjacent to the PA die to reduce distances associated with connections between the IPD and the PA die. In some embodiments, the RF module can be a front-end module (FEM).

In accordance with an number of implementations, the present disclosure relates to a wireless device that includes a transceiver configured to generate a radio-frequency (RF) signal, and a power amplifier (PA) configured to amplify the RF signal. The wireless device further includes an impedance matching device configured to impedance match the amplified RF signal. The impedance matching device includes a primary metal trace having one or more turns between a first end and a second end. The first end of the primary metal trace is connected to a voltage source for the PA. The second end of the primary metal trace is connected to an output node of the PA. The impedance matching device further includes a secondary metal trace having one or more turns between a first end and a second end. The first end of the secondary metal trace is connected to the second end of the primary metal trace. The second end of the secondary metal trace is connected to an output node of the impedance matching device. The primary metal trace and the secondary metal trace are in respective planes separated by a distance. The wireless device further includes an antenna in communication with the output node of the impedance matching device. The antenna is configured to facilitate transmission of the amplified and matched RF signal.

In some implementations, the present disclosure relates to an integrated passive device (IPD) that includes a body and an autotransformer implemented within the body. The autotransformer includes a primary metal trace having one or more turns between a first end and a second end, with the first end of the primary metal trace defining a first node, and the second end of the primary metal trace defining a tap node. The autotransformer further includes a secondary metal trace having one or more turns between a first end and a second end, with the first end of the secondary metal trace being connected to the tap node, and the second end of the secondary metal trace defining a second node. The primary metal trace and the secondary metal trace are in respective planes separated by a distance. The IPD further includes a plurality of contact features implemented to provide electrical connections between the autotransformer and a first substrate.

In some embodiments, the first substrate can be configured to support the primary metal trace. The body can include a second substrate configured to support the second metal trace. The second substrate can be in a flip-mounted configuration with respect to the first substrate to provide the separation distance between the primary metal trace and the secondary metal trace. The first substrate can include a laminate substrate, and the second substrate can include a die substrate.

In some embodiments, the body can include a surface defined by a side of the second substrate opposite from a side on which the secondary metal trace is implemented on. The surface can include a substantially flat surface that allows mounting of one or more components thereon.

In some embodiments, the IPD can further include an insulator layer implemented between the primary metal trace and the secondary metal trace. The insulator layer can have a thickness selected to provide the separation distance. The IPD can further include one or more conductive features implemented through the insulator layer. The conductive feature can be configured to provide one or more electrical connections between the primary metal trace and the secondary metal trace. The insulator layer can include a dielectric material such as benzocyclobutene (BCB), polyimide, SiN (silicon nitride), or SiO2 (silicon dioxide).

In some embodiments, the primary metal trace can be wider than the secondary metal trace. The primary metal trace can be thicker than the secondary metal trace.

In some embodiments, the IPD can further include one or more circuit elements configured to provide matching functionality on either or both sides of the autotransformer. The IPD can be an impedance matching device configured to match impedance for an output of a power amplifier (PA). The primary metal trace can be configured to provide passage of a DC current for the PA. The primary metal trace can be further configured to provide a low impedance path for an RF current. The secondary metal trace and its separation distance with the primary metal trace can be configured to provide strong coupling between the primary and secondary metal traces.

In some teachings, the present disclosure relates to a method for fabricating an integrated passive device (IPD). The method includes providing or forming each of a first substrate and a second substrate. The method further includes implementing a primary metal trace on the first substrate, with the primary metal trace having one or more turns between a first end and a second end. The method further includes implementing a secondary metal trace on the second substrate, with the secondary metal trace having one or more turns between a first end and a second end. The method further includes flip-mounting the second substrate on the first substrate to provide a desired separation distance between the primary metal trace and the secondary metal trace. The flip-mounting includes formation of one or more electrical connections between the primary metal trace and the secondary metal trace to form an autotransformer.

In some embodiments, the method can further include forming an insulator layer between the primary metal trace and the secondary metal trace.

According to a number of implementations, the present disclosure relates to a radio-frequency (RF) module that includes a packaging substrate configured to receive a plurality of components. The RF module further includes a power amplifier (PA) die implemented on the packaging substrate. The PA die includes an output node configured to provide an amplified radio-frequency (RF) signal. The RF module further includes an integrated passive device (IPD) implemented on the packaging substrate. The IPD is configured to receive the amplified RF signal from the PA die. The IPD includes a body, and an autotransformer implemented within the body. The autotransformer is configured to facilitate impedance matching of the amplified RF signal. The RF module further includes a plurality of contact features implemented to provide electrical connections between the autotransformer and the packaging substrate.

In some embodiments, the packaging substrate can be configured to support a primary metal trace of the autotransformer, and the body can include a die substrate configured to support a secondary metal trace of the autotransformer. The die substrate can be in a flip-mounted configuration with respect to the packaging substrate to provide the separation distance between the primary metal trace and the secondary metal trace. The body can include a surface defined by a side of the die substrate opposite from a side on which the secondary metal trace is implemented on. The RF module can further include a component mounted on the surface of the body in a stacked configuration. Such a component can include a band selection switch device. The stack configuration can allow a reduction in lateral size of the RF module.

In some embodiments, the packaging substrate can include a laminate substrate. The IPD having the autotransformer can allow the laminate substrate to have a reduced number of layers.

In some embodiments, the IPD can be positioned adjacent to the PA die to reduce distances associated with connections between the IPD and the PA die. In some embodiments, the RF module can be a front-end module (FEM).

In a number of implementations, the present disclosure relates to a wireless device having a transceiver configured to generate a radio-frequency (RF) signal, and a power amplifier (PA) configured to amplify the RF signal. The wireless device further includes an impedance matching device implemented as an integrated passive device (IPD). The IPD is configured to receive the amplified RF signal from the PA. The IPD includes a body and an autotransformer implemented within the body. The autotransformer is configured to facilitate impedance matching of the amplified RF signal. The wireless device further includes an antenna in communication with the IPD. The antenna is configured to facilitate transmission of the amplified and matched RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/263,870, titled "LOW LOSS IMPEDANCE TRANSFORMERS IMPLEMENTED AS INTEGRATED PASSIVE DEVICES AND RELATED METHODS THEREOF," filed on even date herewith and hereby incorporated by reference herein in its entirety.

BRIEF DESCRIPTION OF THE DRAWINGS

FIG. 1 shows that in some embodiments, a matching circuit having one or more features of the present disclosure can be based on an autotransformer.

FIG. 2A shows that in some embodiments, a matching circuit having one or more features described herein can be implemented as an integrated passive device (IPD).

FIG. 2B shows that in some embodiments, a matching circuit having one or more features described herein can be implemented partly in an IPD and partly in a substrate.

FIG. 3 shows that in some embodiments, a matching circuit having one or more features described herein can be implemented to match an output of a power amplifier (PA).

FIGS. 11-13 show examples of impedance property of an autotransformer with matching on the input side.

DETAILED DESCRIPTION OF SOME EMBODIMENTS

The headings provided herein, if any, are for convenience only and do not necessarily affect the scope or meaning of the claimed invention.

Described herein are examples of autotransformers that can be utilized in, for example, impedance matching circuits for radio-frequency (RF) applications. In some implementations, use of an autotransformer in an impedance matching circuit can result in significant reduction in size of the matching circuit. Accordingly, an area of an RF module such as a multi band multi mode front end MCM (multi-chip module) can also be reduced significantly.

In some implementations, additional benefits can be realized by use of an autotransformer in an impedance matching circuit. For example, a need for a DC choke in a matching circuit can be eliminated. In another example, a matching circuit having an autotransformer can have a wider usable bandwidth than that of a conventional matching circuit. Although various examples are described herein in the context of autotransformers, it will be understood that one or more features of the present disclosure can also be implemented in other types of transformer configurations, including those where first and second coils are not electrically connected.

FIG. 1 shows that in some embodiments, one or more features of the present disclosure can be implemented as an autotransformer 140, and such an autotransformer can be implemented in a matching circuit 100. Although described in the example context of such a matching circuit, it will be understood that one or more features of the present disclosure can be implemented in other RF circuits.

FIG. 2A shows that in some embodiments, a matching circuit 100 or a portion of such a matching circuit having one or more features described herein can be implemented in an integrated passive device (IPD) 102. Examples of such an implementation are described herein in greater detail FIG. 2B shows that in some embodiments, a matching circuit 100 or a portion of such a matching circuit having one or more features described herein can be implemented in an IPD 102 and a substrate 104 (e.g., a laminate packaging substrate). Examples of such an implementation are described herein in greater detail.

FIG. 3 shows that in some embodiments, a matching circuit 100 having one or more features described herein can be implemented to provide impedance matching for an output 110 of a power amplifier (PA) 108. Although described in such an example context, it will be understood that the matching circuit 100 can also be implemented in other applications.

Figure 4:
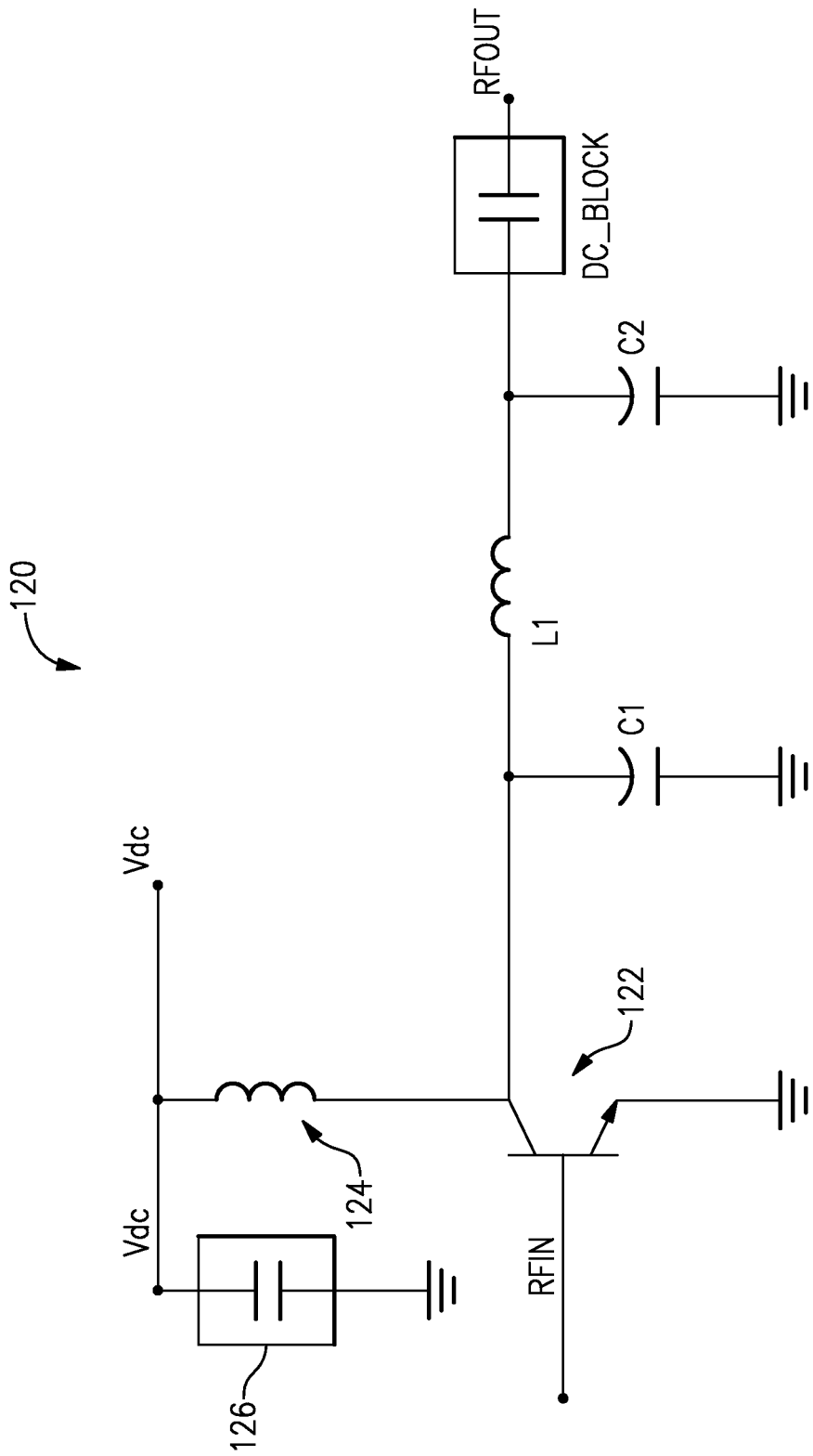
FIG. 4 shows an example configuration of a conventional impedance matching circuit coupled to an output of a PA.

FIG. 4 shows an example configuration 120 of a conventional impedance matching circuit coupled to an output of an amplifying transistor 122. An RF signal is shown to be input into the base of the transistor 122, and an amplified RF signal is shown to be output through the collector of the transistor 122. As shown, the amplified RF signal can be subjected to one or more harmonic traps, as well as a DC block, before reaching an output node (RFOUT).

In the example configuration 120, an impedance matching circuit is shown to include a choke inductance 124. The choke inductance 124 is shown to be implemented between a collector voltage (Vdc) node and the collector of the transistor 122. The collector voltage node is also shown to be coupled to ground through a decoupling capacitance 126.

In the example configuration 120, the collector of the amplifying transistor 122 is shown to be coupled to the output node (RFOUT) through an inductance L1 and a DC block capacitance (DC_Block). Capacitive couplings with ground before (through capacitance C1) and after (through capacitance C2) the inductance L1 can be configured to provide, for example, low pass filtering functionality for the amplified RF signal. Although the example shunts to ground involving C1 and C2 are described in the context of capacitive shunts, it will be understood that any combination of capacitance, inductance and resistance elements can also be utilized. Such shunt paths having capacitance, inductance, resistance, or any combination thereof can also be implemented in other shunt examples described herein.

Figure 5:
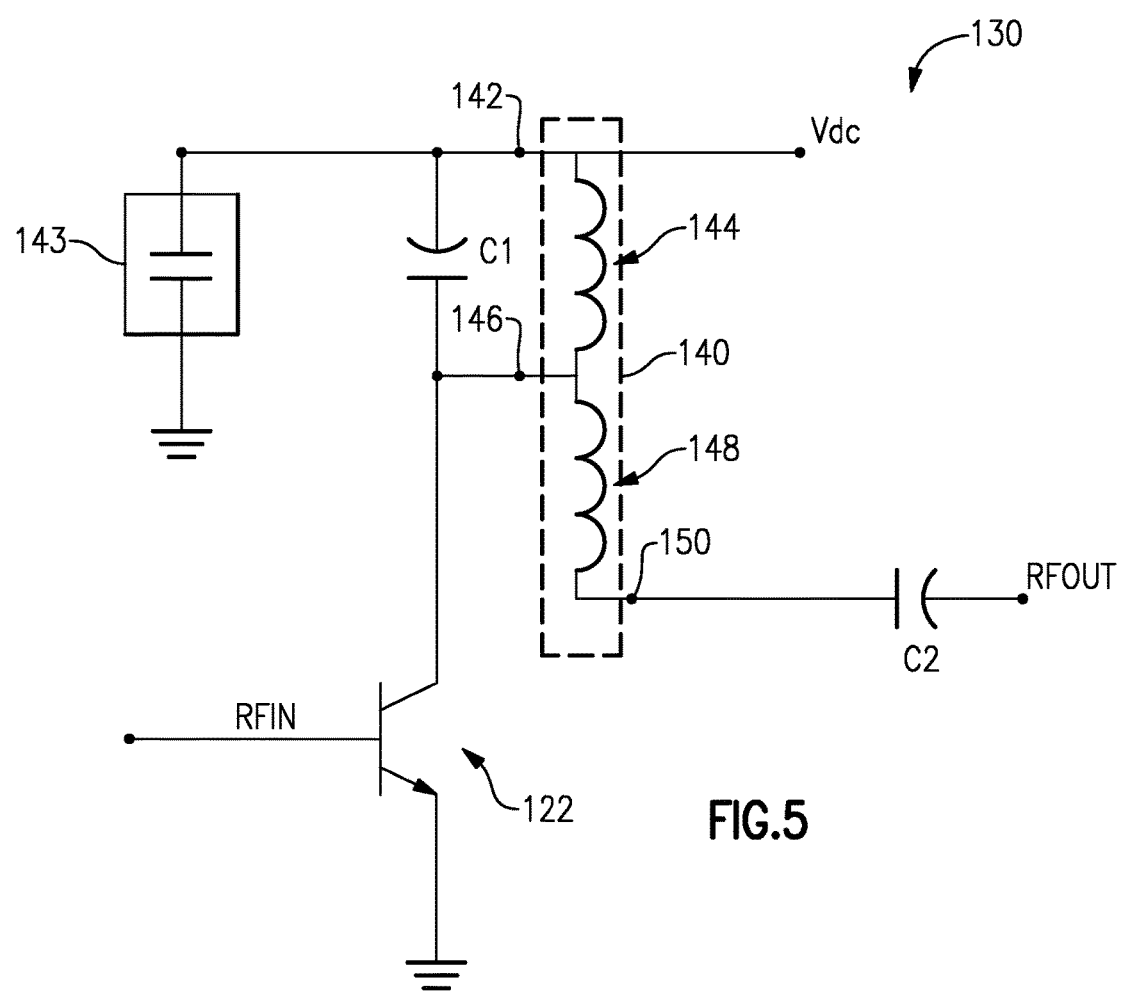
FIG. 5 shows an example configuration of an impedance matching circuit coupled to an output of a PA.

FIG. 5 shows an example configuration 130 of an impedance matching circuit coupled to an output of an amplifying transistor 122. Similar to the example of FIG. 4, an RF signal is shown to be input into the base of the transistor 122, and an amplified RF signal is shown to be output through the collector of the transistor 122.

The impedance matching circuit of FIG. 5 is shown to include an autotransformer 140 having a primary coil 144 and a secondary coil 148 connected in series. The primary end (node 142) of the autotransformer 140 is shown to be connected to a collector voltage (Vdc) node. The secondary end (node 150) of the autotransformer 140 is shown to be connected to a capacitance C2 which is in turn connected to an output node (RFOUT). In some embodiments, C2 can be configured to resonate out leakage inductance of the autotransformer 140. In such embodiments, C2 can be approximated as $C2=1/[(2\pi f)^2 L_{leak}]$.

In FIG. 5, a capacitance C1 is shown to be connected between the Vdc node and tap a node 146 that is between the primary coil 144 and the secondary coil 148. In some embodiments, C1 can be configured to resonate out magnetizing inductance of the autotransformer 140. In such embodiments, C1 can be approximated as $C1=1/[(2\pi f)^2 L_{mag}]$.

In FIG. 5, the collector output of the transistor 122 is shown to be connected to the tap node 146 between the primary and secondary coils 144, 148. Also, a decoupling capacitance 143 is shown to terminate an RF current at the Vdc node (142).

Configured in the foregoing manner, the primary coil 144 can be used to pass a DC current (Vdc) of the transistor 122 as well as the RF current of the low impedance circuit. Thus, the primary coil 144 can be re-used in both low impedance and high impedance branches of the circuit, thereby reducing the size and electrical loss of the matching circuit.

Figure 6:
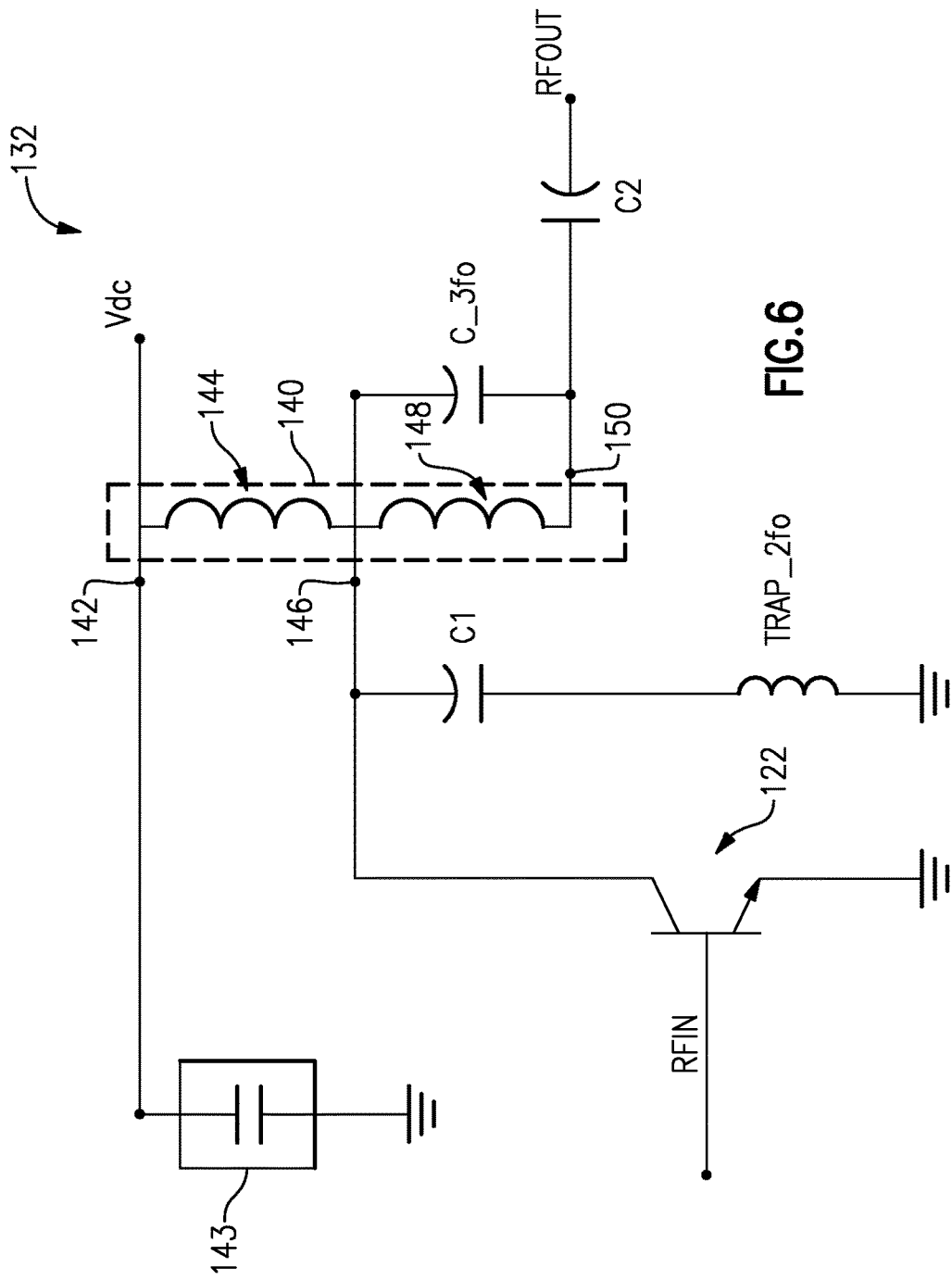
FIG. 6 shows another example configuration of an impedance matching circuit coupled to an output of a PA.

FIG. 6 shows another example configuration 132 of an impedance matching circuit coupled to an output of an amplifying transistor 122. Similar to the example of FIG. 4, an RF signal is shown to be input into the base of the transistor 122, and an amplified RF signal is shown to be output through the collector of the transistor 122.

The impedance matching circuit of FIG. 6 is shown to include an autotransformer 140 having a primary coil 144 and a secondary coil 148 connected in series. The primary end (node 142) of the autotransformer 140 is shown to be connected to a Vdc node. The secondary end (node 150) of the autotransformer 140 is shown to be connected to a capacitance C2 which is in turn connected to an output node (RFOUT). In some embodiments, C2 can be configured to resonate out leakage inductance of the autotransformer 140. In such embodiments, C2 can be approximated as $C2=1/[(2\pi f)^2 L_{leak}]$.

In FIG. 6, the collector output of the transistor 122 is shown to be connected to a tap node 146 between the primary and secondary coils 144, 148. Also, a decoupling capacitor is shown to terminate an RF current at the Vdc node (142).

FIG. 6 shows that one or more harmonic traps can be implemented to achieve harmonic termination conditions for various classes of operation. For example, a primary matching capacitance C1 and an inductance (Trap_2fo) are shown to be arranged in series between the tap node 146 and ground; and such an arrangement can be utilize as a second harmonic trap. In another example, a secondary matching capacitance (C_3fo) can be implemented between the tap node 146 and the secondary end node 150 to block third harmonic.

Figure 7:
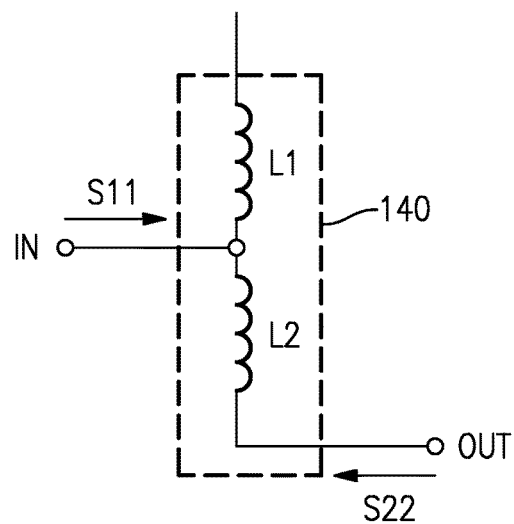
FIGS. 7 and 8 show examples of impedance property of an autotransformer by itself.
Figure 8:
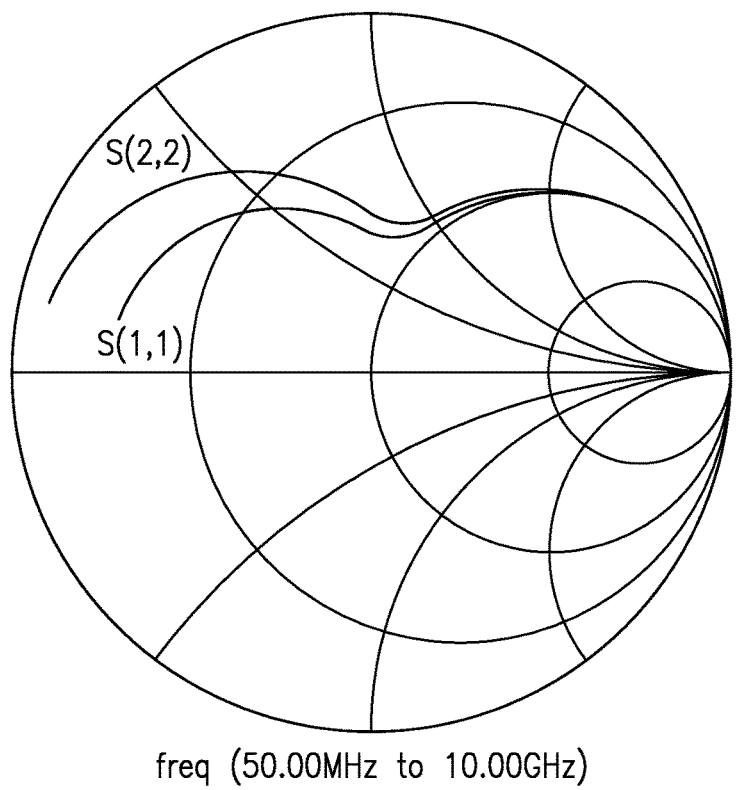

FIGS. 7-15 show various non-limiting examples of design features that can be considered and implemented to yield desirable performance of matching circuits based on autotransformers. FIGS. 7 and 8 show examples of impedance property of an autotransformer by itself. More particularly, FIG. 7 shows an autotransformer 140 having a primary inductance L1 and a secondary inductance L2. The autotransformer 140 is shown to be provided with an input (In) at a tap node between L1 and L2. An output (Out) is shown to be at an end node of L2. Accordingly, input and output reflection coefficients S11, S22 can be characterized as shown.

FIG. 8 shows a Smith plot of impedance associated with S11 (S(1,1)) and S22 (S(2,2)) of the example of FIG. 7, as frequency is swept from 50 MHz to 10 GHz. For the Smith plot of FIG. 8, L1=1 nH, L2=16 nH, and a turn ratio of 4 (e.g., N1=1, N2=4), resulting in a coupling coefficient Kc of approximately 0.9. It is noted that with such a configuration, higher coil loss can occur in the form of, resulting from and/or resulting in, for example, higher Re(Zin) and more Z-ratio dispersion. It is also noted that lower primary inductance can occur in the form of, resulting from and/or resulting in, for example, smaller bandwidth and higher residual inductance. It is also noted that lower coupling efficiency can occur in the form of, resulting from and/or resulting in, for example, lower bandwidth and higher residual inductance.

Figure 9:
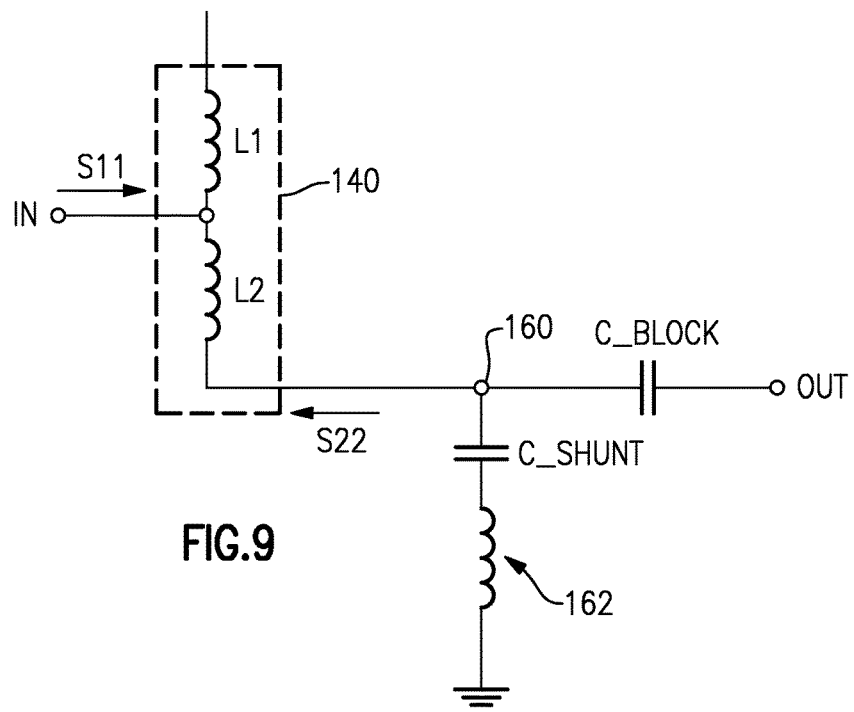
FIGS. 9 and 10 show examples of impedance property of an autotransformer with matching on the output side.
Figure 10:
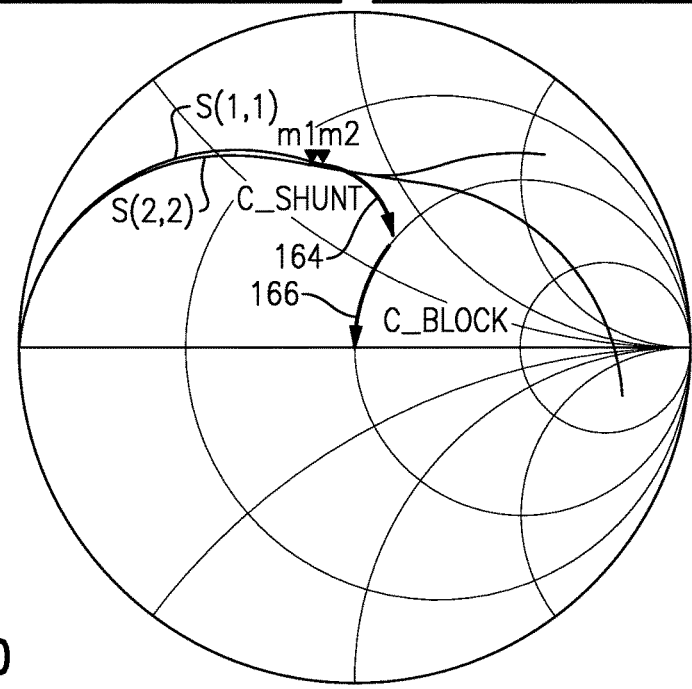

FIGS. 9 and 10 show examples of impedance property with matching of the output side of an autotransformer. More particularly, FIG. 9 shows an autotransformer 140 having a primary inductance L1 and a secondary inductance L2. The autotransformer 140 is shown to be provided with an input (In) at a tap node between L1 and L2. An output (Out) is shown to be obtained from an end node 160 of L2 through a DC block capacitance (C_block). A shunt arm with a capacitance (C_shunt) and an inductance 162 is shown to couple the node 160 with ground. Accordingly, input and output reflection coefficients S11, S22 of the autotransformer 140 can be characterized as shown.

FIG. 10 shows a Smith plot of impedance associated with S11 (S(1,1)) and S22 (S(2,2)) of the example of FIG. 9, as frequency is swept from 0 Hz (DC) to 6 GHz. For the Smith plot of FIG. 10, the turn ratio between the secondary coil (N2) and the primary coil (N1) is 3.75 (e.g., N1=1, N2=3.75). It is noted that the shunt arm (with C_shunt) and the DC block capacitance (C_block) can be configured to move the impedances associated with both S11 and S22 toward a matched impedance Zo. For example, the shunt arm (with C_shunt) can be configured to move the impedances from impedance values m1 and m2 towards Zo along, for example, an impedance profile 164. In another example, the DC block capacitance (C_block) can be configured to further move the impedances resulting from the shunt arm (with C_shunt) toward Zo along, for example an impedance profile 166.

FIGS. 11-13 show examples of impedance property with matching of the input side of an autotransformer. More particularly, FIG. 11 shows an autotransformer 140 having a primary inductance L1 and a secondary inductance L2. The autotransformer 140 is shown to be provided with an input (In) through an inductance (L_series) to a tap node 170 between L1 and L2. An output (Out) is shown to be at an end node of L2. A shunt arm with a capacitance (C_shunt) and an inductance 172 is shown to couple the node 170 with ground. A capacitance C1 is shown to provide a parallel path with the primary inductance L1, between the node 170 and an end node 174 of L1. The end node 174 is shown to be coupled to ground through a decoupling capacitance (C_decouple). In some embodiments, either or both of the shunt capacitance (C_shunt) and the parallel-path capacitance (C1) can be implemented. Accordingly, input and output reflection coefficients S11, S22 of the autotransformer 140 can be characterized as shown.

In some embodiments, inductance for one or more of the inductances of the example of FIG. 11 can be provided by one or more conductor features between two nodes. For example, and as shown in FIG. 12, the inductance L_series can be provided by an assembly of one or more wirebonds 180 between conductive pads 176, 178. The conductive pad 176 can be connected to the input node (In), and the conductive pad 178 can be connected to the node 170. As described herein, such wirebonds can be configured to provide desired impedance values for various matching features implemented with autotransformers.

FIG. 13 shows a Smith plot of impedance associated with S11 (S(1,1)) and S22 (S(2,2)) of the example of FIG. 11, as frequency is swept from 0 Hz (DC) to 6 GHz. For the Smith plot of FIG. 13, the turn ratio between the secondary coil (N2) and the primary coil (N1) is 3.75 (e.g., N1=1, N2=3.75). Similar results can be obtained for configurations each having one of the shunt capacitance (C_shunt) and the parallel-path capacitance (C1), but not the other. It is noted that either of the shunt arm (with C_shunt) and the parallel-path capacitance (C1), and the inductance (L_series), can be configured to move the impedances associated with both S11 and S22 toward a matched impedance Zo. For example, the shunt arm (with C_shunt) can be configured to move the impedances from impedance values m1 and m2 along, for example, an impedance profile 182. In another example, the inductance (L_series) can be configured to further move the impedances resulting from the shunt arm (with C_shunt) toward Zo along, for example an impedance profile 184.

Figure 14:
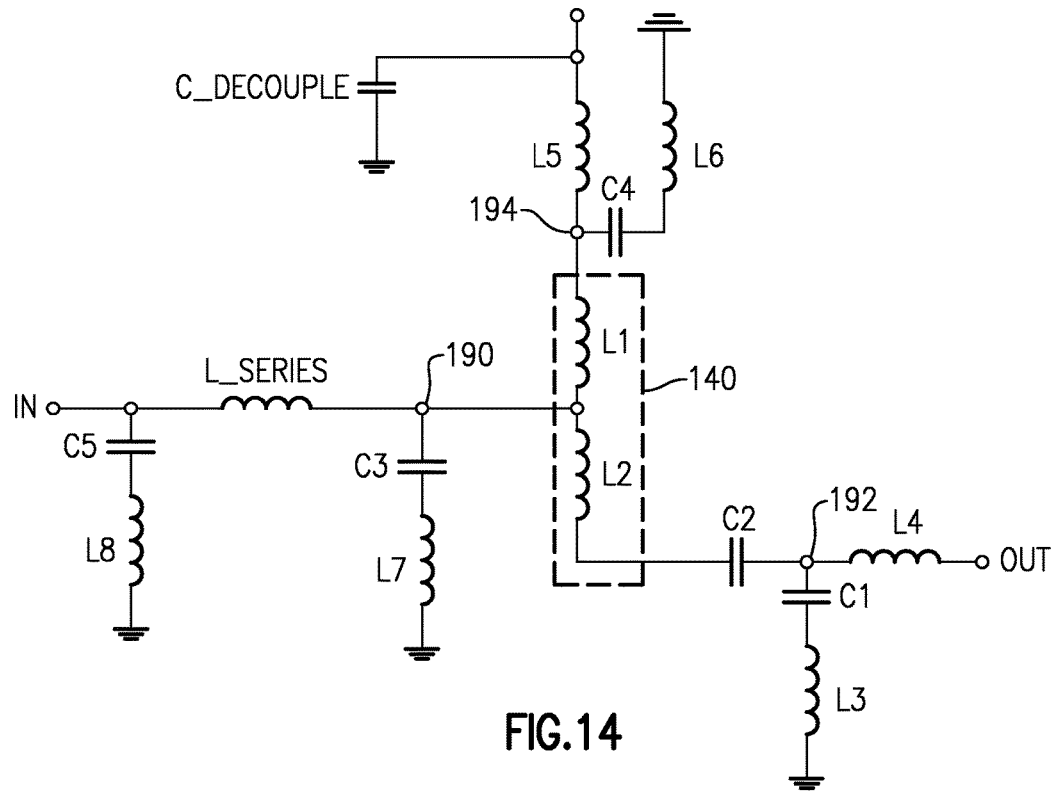
FIG. 14 shows an example of a matching circuit having matching on the input side and the output side of an autotransformer.

FIG. 14 shows an example of a matching circuit with matching on both of the input side and the output side of an autotransformer. Such a matching circuit can include one or more features described in the examples of FIGS. 9-13, as well as one or more features that can facilitate combining of input-side matching and output-side matching.

In the example of FIG. 14, an autotransformer 140 having a primary inductance L1 and a secondary inductance L2 is shown to be provided with an input (In) through an inductance (L_series) to a tap node 190 between L1 and L2. An output (Out) is shown to be obtained from an end node of L2, through a capacitance C2, and an inductance L4. On the input side, a shunt arm with a capacitance C3 and an inductance L7 is shown to couple the node 190 with ground. Also on the input side, a shunt arm with a capacitance C5 and an inductance L8 is shown to couple the input node with ground. On the output side, a shunt arm with a capacitance C1 and an inductance L3 is shown to couple a node 192 between C2 and L4 with ground.

In the example of FIG. 14, an end node 194 of the primary inductance L1 can be a supply voltage (VCC) node. Decoupling functionality can be provided by an inductance L5 between the VCC node 194 and a decoupling capacitance (C_decouple) which is in turn connected to ground. A coupling path between the VCC node and ground through a capacitance C4 and an inductance L6 can be configured to provide VCC bypass and primary RF ground functionality.

In the example of FIG. 14, the input-side shunt arm with C3 and L7 can be configured to provide primary residual tuning functionality, as well as a trap for second harmonic. The output-side shunt arm with C1 and L3 can be configured to provide output (S22) match tuning functionality, as well as a trap for third harmonic. The capacitance C2 can be configured to provide DC blocking and output matching functionalities.

In the example of FIG. 14, the shunt arm with C5 and L8 can be configured to trap second harmonic. In some embodiments, such a shunt arm can be implemented in a die that is separate from a device (e.g., an IPD) having the autotransformer 140 and related matching features. Examples related to such a device are described herein in greater detail.

Figure 15:
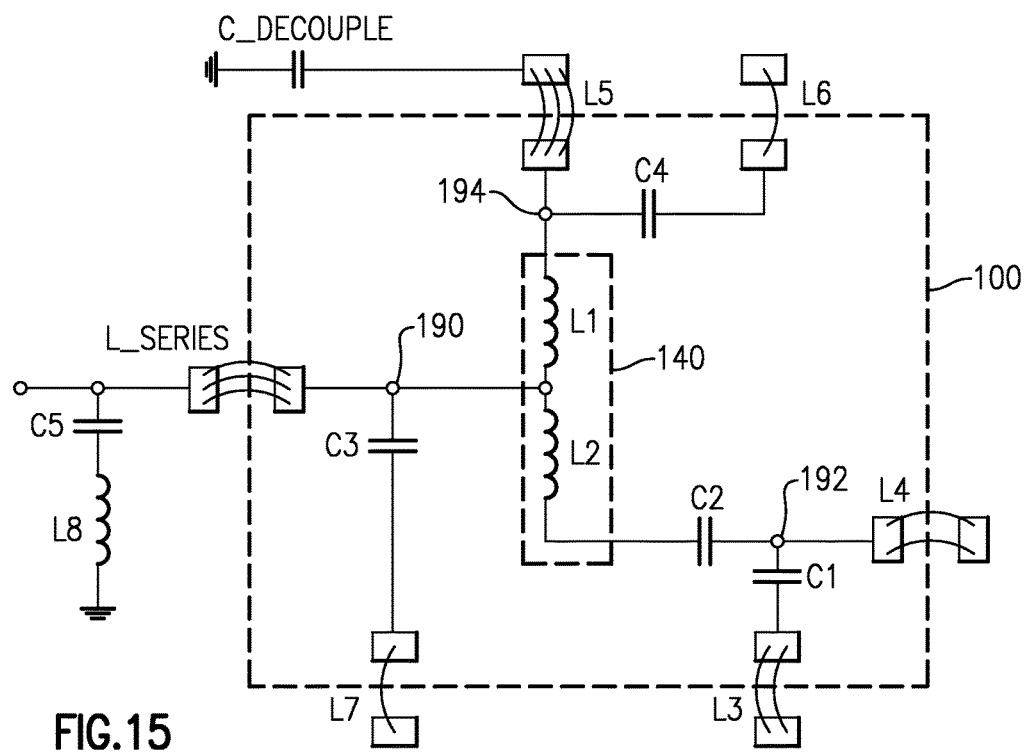
FIG. 15 shows an example configuration where the matching circuit of FIG. 14 includes some of the inductances being provided by conductors such as wirebonds.

FIG. 15 shows the same matching configuration as in the example of FIG. 14, but with selected inductances provided by conductor features such as wirebonds. Such wirebonds can be implemented to provide electrical connections between a matching circuit device 100 (e.g., an IPD) and other components or nodes outside of the device 100. For example, the inductance L_series can be implemented as one or more wirebonds to connect the node 190 to an output of a PA (not shown). The second-harmonic trap with C5 and L8, shown to be outside of the device 100, can be implemented on the same die as the PA.

In other examples, inductances associated with L5, L6, L7, L4 and L4 can be provided by respective assemblies, with each assembly having one or more wirebonds configured to provide electrical connection between the device 100 and a node outside of the device 100. For example, the wirebond-assemblies associated with L7, L3 and L6 can provide connections to grounding pads outside of the device. The wirebond-assembly associated with L4 can provide connection of the node 192 to an RF output pad outside of the device 100.

Figure 16:
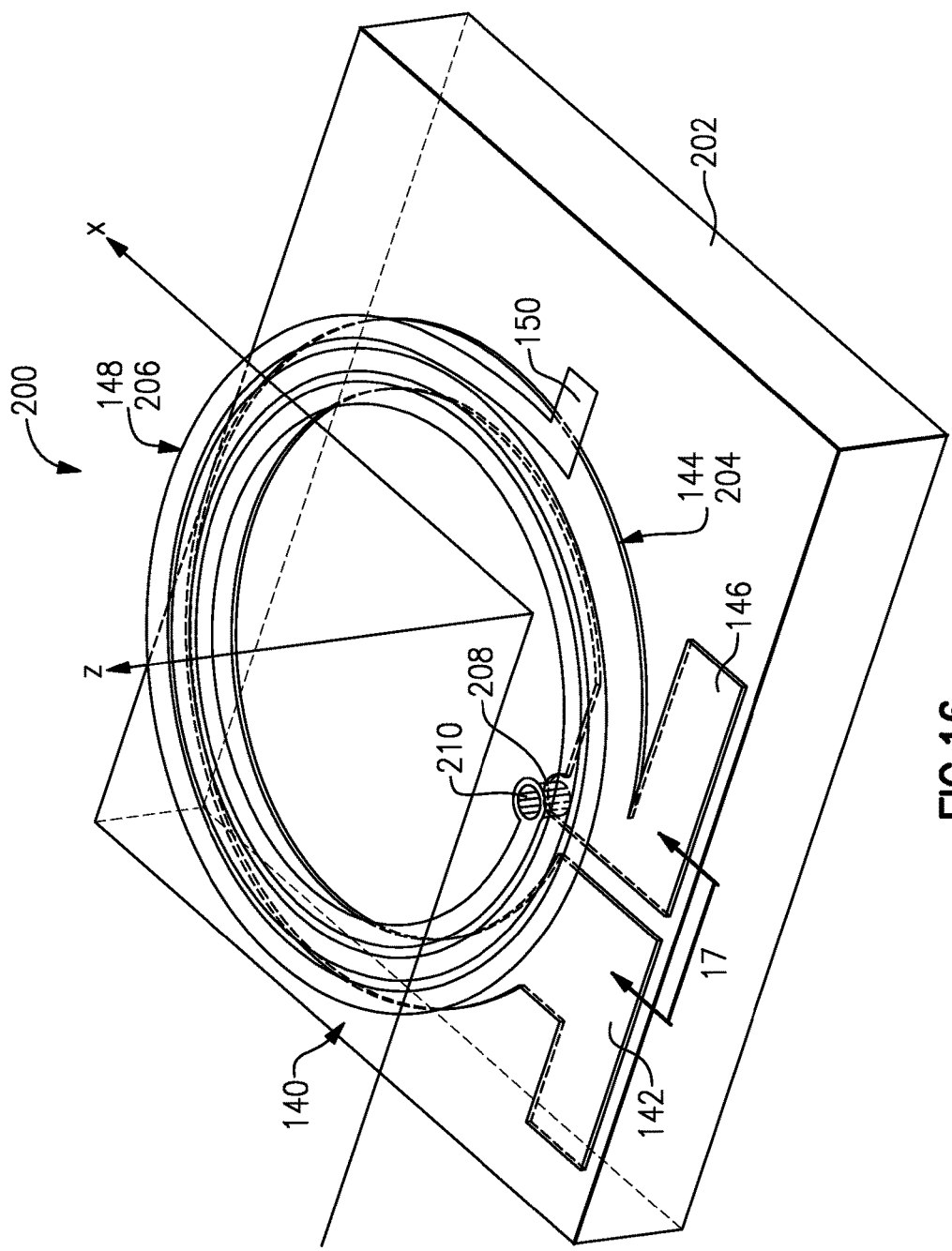
FIG. 16 shows an example configuration where an autotransformer having tightly coupled primary and secondary coils is implemented as an IPD.

In some embodiments, some or all of matching circuits described herein (e.g., including the examples shown in FIGS. 5-15) can be implemented as an integrated passive device (IPD). FIG. 16 shows an example configuration where an autotransformer 140 having tightly coupled primary and secondary coils 144, 148 is implemented as an IPD 200. Although not shown, other components (e.g., capacitances, inductances, conductive paths, etc.) can be included in the IPD 200.

More particularly, the IPD 200 is shown to include a die substrate 202 which can be, for example, an insulating or high-resistivity semiconductor substrate. The primary coil 144 can be implemented as one or more turns of a metal trace 204 formed on a surface of the die substrate 202. The primary metal trace 204 can be configured to allow handling of DC current of the amplifying transistor (e.g., 122 in FIGS. 5 and 6) as well as RF current of the low impedance circuit.

The secondary coil 148 can be implemented as one or more turns of a metal trace 206 formed over the primary metal trace 204. In the example shown, the secondary metal trace 206 has multiple turns, and the primary metal trace 204 has one turn. It will be understood that other numbers of turns for each of the primary and secondary metal traces are also possible. It will also be understood that each of the primary and secondary metal traces can have non-integer number of turns, including less than one turn.

An electrically insulating layer can be provided between the primary metal trace 204 and the secondary metal trace 206. Thickness of such an insulating layer can provide a separation distance between the primary and secondary metal traces 204, 206. Accordingly, such a thickness of the insulating layer can be selected to provide sufficient separation, yet close enough for strong coupling between the two coils 144, 148.

As shown in FIG. 16, one end of the primary metal trace 204 can be electrically connected to one end of the secondary metal trace 206. For example, suppose that a contact pad 142 (of the primary metal trace 204) is to be electrically connected to a Vdc node, and a contact pad 146 (also of the primary metal trace 204) is to be electrically connected to a collector (thereby act as an input of the autotransformer). Further, suppose that a contact pad 150 (of the secondary metal trace 206) is to be connected to an RF output (and also act as an output of the autotransformer). Then, an inner end 210 of the secondary metal trace 206 can be electrically connected to the contact pad 146 by, for example, an inter-layer conductive via 208.

As indicated in FIG. 16, a sectional view of a portion of the IPD 200 is shown in FIG. 17. More particularly, FIGS. 17A-17D show various stages of an example IPD fabrication process. FIG. 17A shows a stage where a die substrate 202 can be provided, and a primary metal trace 204 can be formed on an upper surface of the die substrate 202. In some embodiments, the primary metal trace 204 can be formed by utilizing techniques such as masking, metal deposition, and etching.

Figure 17A:
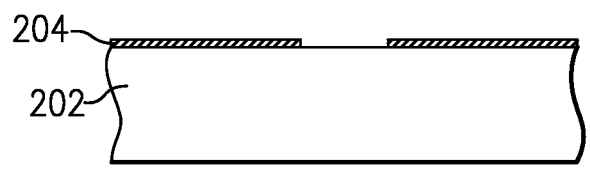
FIGS. 17A-17D show various stages of an example fabrication process for the example IPD of FIG. 16.
Figure 17B:
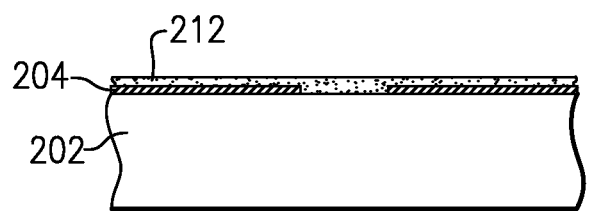

FIG. 17B shows a stage where an electrically insulating layer 212 can be formed so as to cover the primary metal trace 204. In some embodiments, materials such as oxide or dielectric material can be deposited so as to form the insulating layer 212.

Figure 17C:
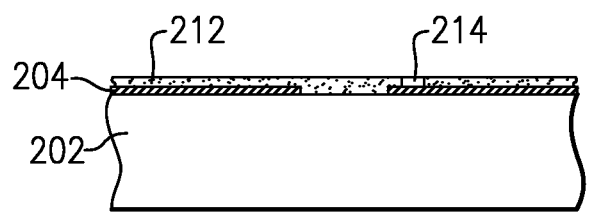

FIG. 17C shows a stage where an opening 214 can be formed through the insulating layer. In some embodiments, such an opening can be formed by patterned etching, focused laser, etc.

Figure 17D:
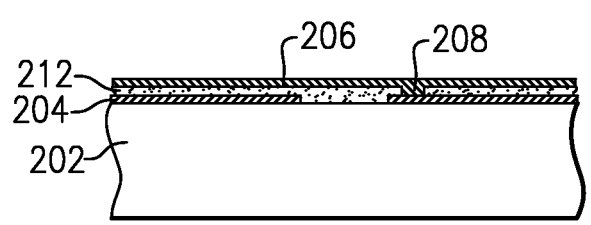

FIG. 17D shows a stage where a secondary metal trace 208 can be formed on the insulating layer 212. In some embodiments, the secondary metal trace 208 can be formed by utilizing techniques such as printing, masking, metal deposition, and etching. Such a formation of the secondary metal trace 208 can result in the opening 214 (FIG. 17C) being filled so as to yield a conductive inter-layer via 208.

As further shown in FIG. 17D, the thickness (d1) of the insulating layer 212 between the primary and secondary metal traces 204, 206 can be selected to provide sufficient separation of the metal traces, yet provide a desirable coupling between the two metal traces.

Figure 18:
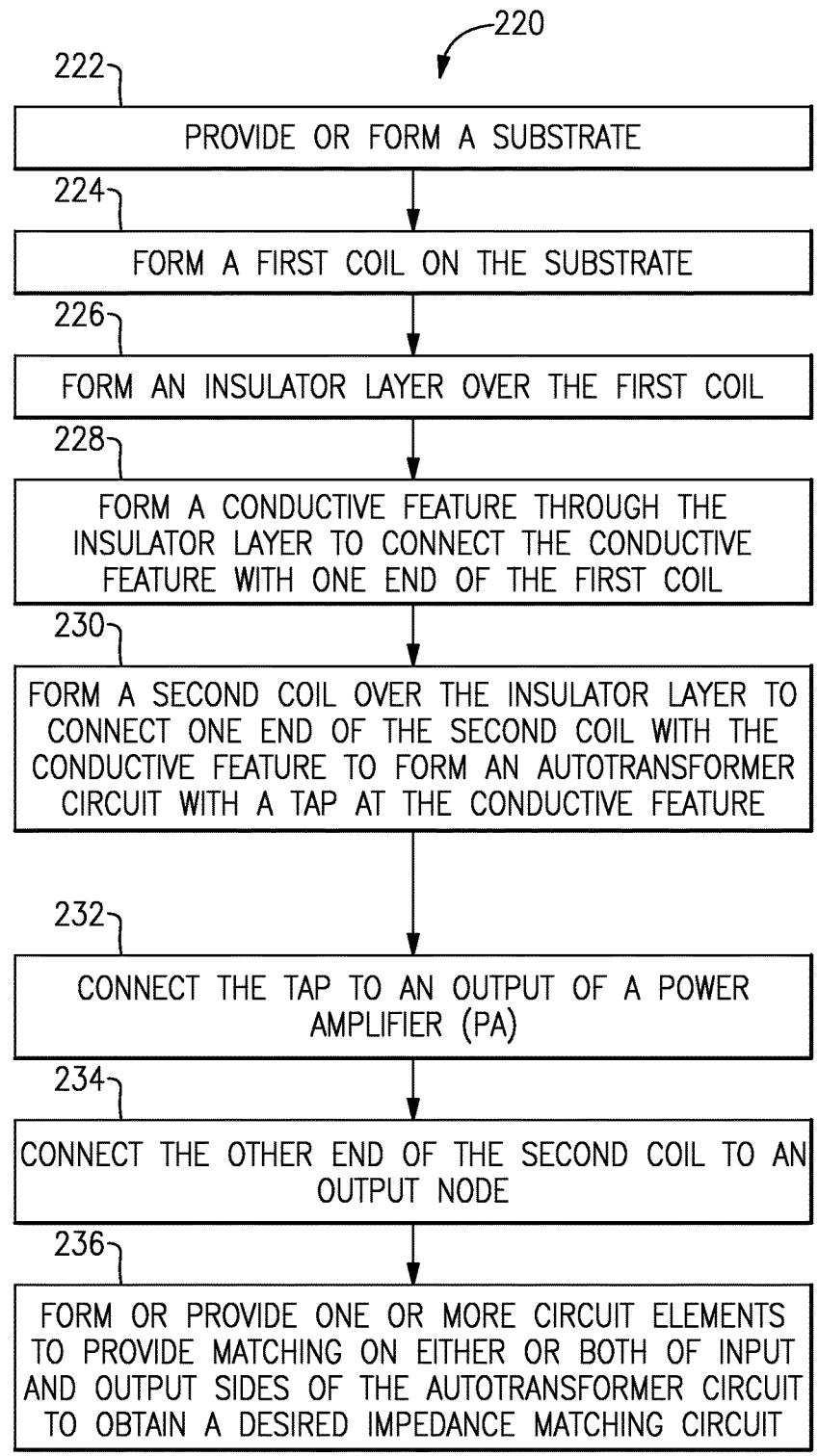
FIG. 18 shows a process that can be implemented to fabricate the example IPD of FIGS. 16 and 17.

FIG. 18 shows a process 220 that can be implemented to fabricate an IPD such as the example described in reference to FIGS. 16 and 17. In block 222, a substrate can be provided or formed. In block 224, a first coil can be formed on the substrate. In block 226, an insulator layer can be formed over the first coil. In block 228, a conductive feature can be formed through the insulator layer to form an electrical connection with one end of the first coil. Such a conductive feature can be formed separately, or during the formation of a second coil. In block 230, a second coil can be formed over the insulator layer such that one end of the second coil is electrically connected with the conductive feature to thereby form an autotransformer circuit. The conductive feature which connects the ends of the first and second coils can provide a tap node for the autotransformer circuit. The first coil can be configured as a primary coil, and the second coil can be configured as a secondary coil.

In some embodiments, the tap node can be electrically connected with, or be configured to accept an electrical connection with, an output of a power amplifier (PA) in block 232. In block 234, the other end of the second coil can be electrically connected with, or be configured to accept an electrical connection with, an output of a matching circuit that includes the autotransformer.

As described herein, such a matching circuit can include one or more components or circuits for providing matching on either or both sides of the autotransformer. In block 236, such components or circuits that are part of the IPD can be formed or provided to yield a desired impedance matching functionality for the IPD.

Figure 19:
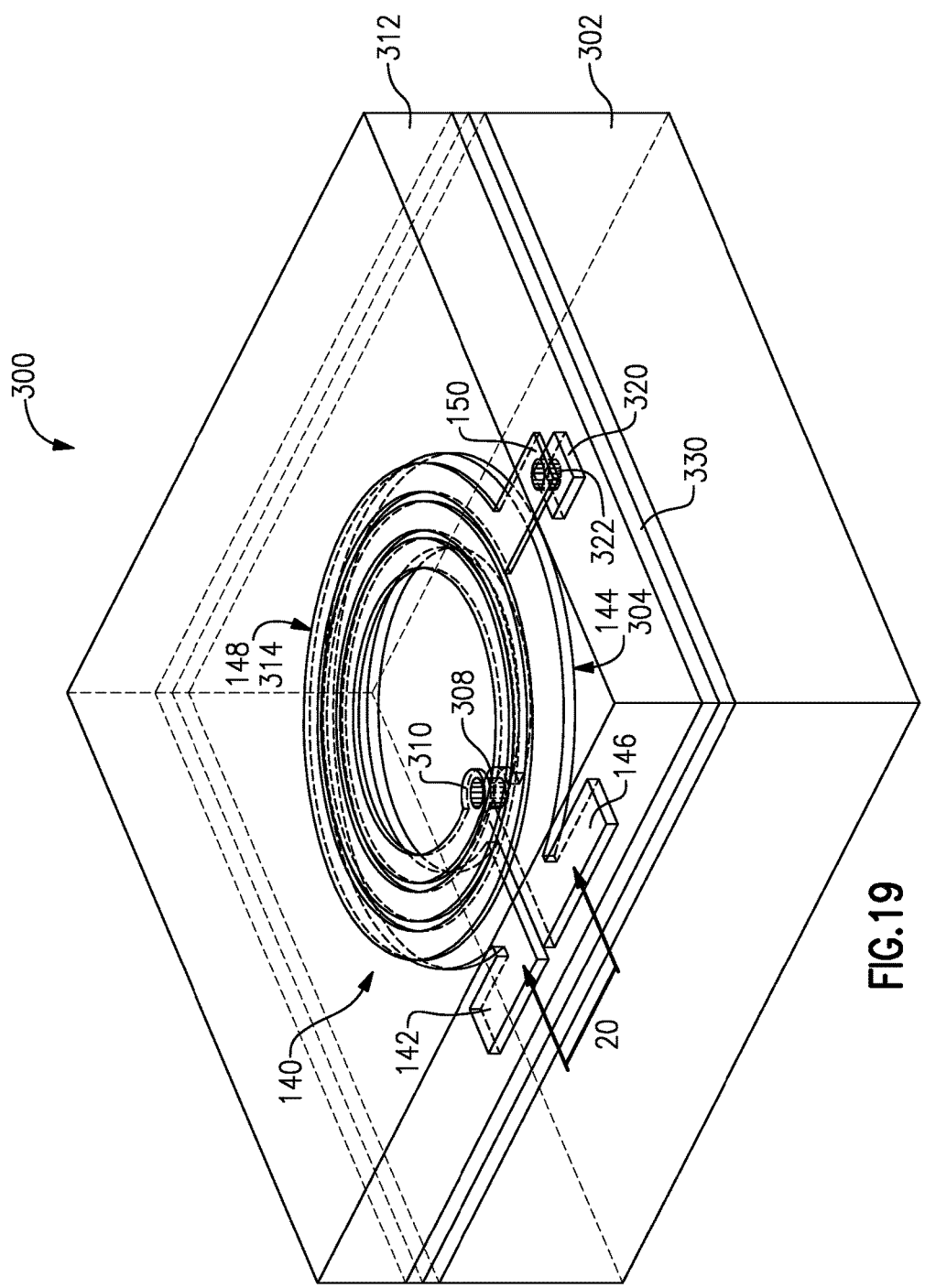
FIG. 19 shows another example configuration where an autotransformer having tightly coupled primary and secondary coils is implemented such that the primary coil is on a first substrate and the secondary coil is on a second substrate.

In some embodiments, some or all of matching circuits such as the examples shown in FIGS. 5-15 can be implemented partly as an IPD, and partly on a packaging substrate of a module 300 on which the IPD is mounted to. FIG. 19 shows an example configuration where an autotransformer 140 having primary and secondary coils 144, 148 is implemented so that the primary coil 144 is implemented on a packaging substrate 302, and the secondary coil 148 is implemented on a die substrate 312. Although not shown, other components can also be provided.

In the example of FIG. 19, the primary coil 144 can also be implemented on a die substrate 302 such that the module 300 includes first and second die (302, 312) with their respective coils (144, 148). Similarly, both of the primary and secondary coils 144, 148 can also be implemented on respective packaging substrates. Accordingly, a substrate on which a coil is implemented on can be a die substrate such as a semiconductor substrate, a packaging substrate such as a laminate substrate, or any combination thereof. Thus, the module 300 can be an IPD itself, and is described as such in some of the examples disclosed herein.

In the example of FIG. 19, the module 300 is shown to include the second substrate 312 mounted on the first substrate 302. The second substrate 312 can be, for example, an insulating or high-resistivity semiconductor substrate, or a laminate substrate. The first substrate 302 can be, for example, a laminate substrate, or an insulating or high-resistivity semiconductor substrate.

The primary coil 144 can be implemented as one or more turns of a metal trace 304 formed on a surface of the substrate 302. The primary metal trace 304 can be configured to allow handling of DC current of the amplifying transistor (e.g., 122 in FIGS. 5 and 6) as well as RF current of the low impedance circuit.

The secondary coil 148 can be implemented as one or more turns of a metal trace 314 formed on a surface of the substrate 312. In the example shown, the secondary metal trace 314 has multiple turns, and the primary metal trace 304 has one turn. It will be understood that other numbers of turns for each of the primary and secondary metal traces are also possible.

In the example shown in FIG. 19, the side of the substrate 312 on which the secondary metal trace 314 is formed is shown to be mounted on the side of the substrate 302 on which the primary metal trace 304 is formed. In some embodiments, such a mounting configuration can be facilitated by, for example, surface mount technology (SMT). For example, bumpless connections (e.g., about 25 μm stand off distance) can be utilized to mount the secondary metal trace 314 on the primary metal trace 304 at one or more locations. For example, a bumpless connection 308 is shown to electrically connect an inner end 310 of the secondary metal trace 314 with a contact pad 146. In another example, a bumpless connection 322 is shown to electrically connect a contact pad 150 on an outer end of the secondary metal trace 314 with a contact pad 320 on the substrate 302.

In the example of FIG. 19, the contact pads 142, 146 and 320 (with 150) on the packaging substrate 302 can form the nodes as described in reference to FIGS. 5-15. As described herein, the contact pads 142, 146 and 320 can be electrically connected to locations on the lower surface of the substrate 302.

In some implementations, an electrically insulating material can be introduced between the primary and secondary metal traces 304, 306. For example, the space between the mounted secondary metal trace 306 and the primary metal trace 304 can be under-filled with an insulating material such as a dielectric material. Such a material can also fill the spaces between the traces of a given coil. In FIG. 19, the insulating material between the primary and secondary metal traces 304, 306 is indicated as a layer 330.

As indicated in FIG. 19, a sectional view of a portion of the module/IPD 300 is shown in FIG. 20. More particularly, FIGS. 20A-20D show various stages of an example fabrication process. FIG. 20A shows a stage where a first substrate 302 can be provided, and a primary metal trace 304 can be formed on an upper surface of the first substrate 302. In some embodiments, the primary metal trace 304 can be formed by utilizing techniques such as masking, metal deposition, and etching.

Figure 20A:
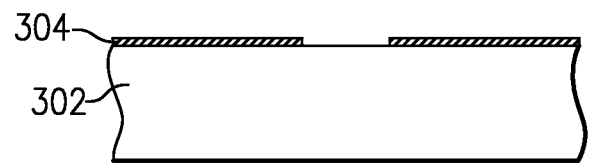
FIGS. 20A-20D show various stages of an example fabrication process for the example IPD of FIG. 19.
Figure 20B:
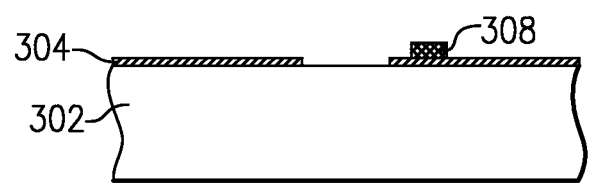

FIG. 20B shows a stage where a bumpless contact feature 308 can be formed on the primary metal trace 304. In some embodiments, such a bumpless contact feature can be implemented using known SMT techniques.

Figure 20C:
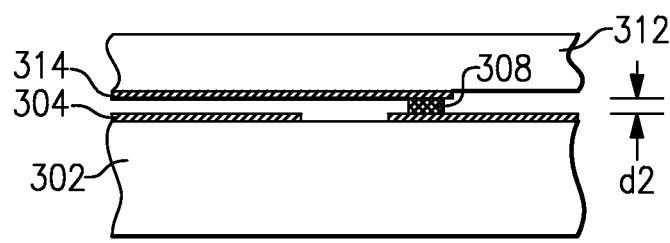

FIG. 20C shows a stage where an assembly of a secondary metal trace 306 formed on a surface of a second substrate 312 can be mounted on the primary metal trace 304. In the example shown, the bumpless contact feature 308 can facilitate such a mounting.

Figure 20D:
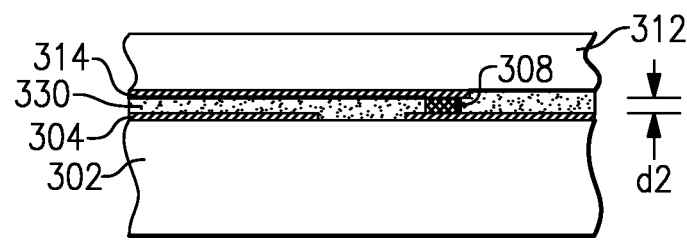

FIG. 20D shows a stage where an insulating material 330 can be introduced between the primary metal trace 304 and the secondary metal trace 306. Such material can be introduced by, for example, under-filling the space between the primary and secondary metal traces 304, 306. In some embodiments, the insulating material 330 can be, for example, a dielectric material.

As further shown in FIG. 20D, the distance (d2) between the primary and secondary metal traces 304, 306 can be effectuated by, for example, the dimension of the bumpless contact feature 308. Such a distance can be selected to provide a number of features such as a desirable coupling between the two coils, and a desirable capacitance between the two coils.

In some embodiments, either or both of the primary and secondary metal traces 304, 306 can be configured to provide a number of desirable features. For example, thickness of a given metal trace can be selected to provide a desired insertion loss to thereby improve the autotransformer performance. In another example, other parameters such as trace width and overall coil size can be adjusted to yield desirable performance of the autotransformer. Examples of design considerations based on such parameters are described herein in greater detail.

In some embodiments, it may not be possible or practical to position the primary and secondary metal traces 304, 306 of FIG. 20D as closely as in the example of FIG. 17D. Accordingly, coupling efficiency may be reduced in such a situation. However, such an effect can be compensated by one or more tuning capacitances connected to the autotransformer.

Figure 21:
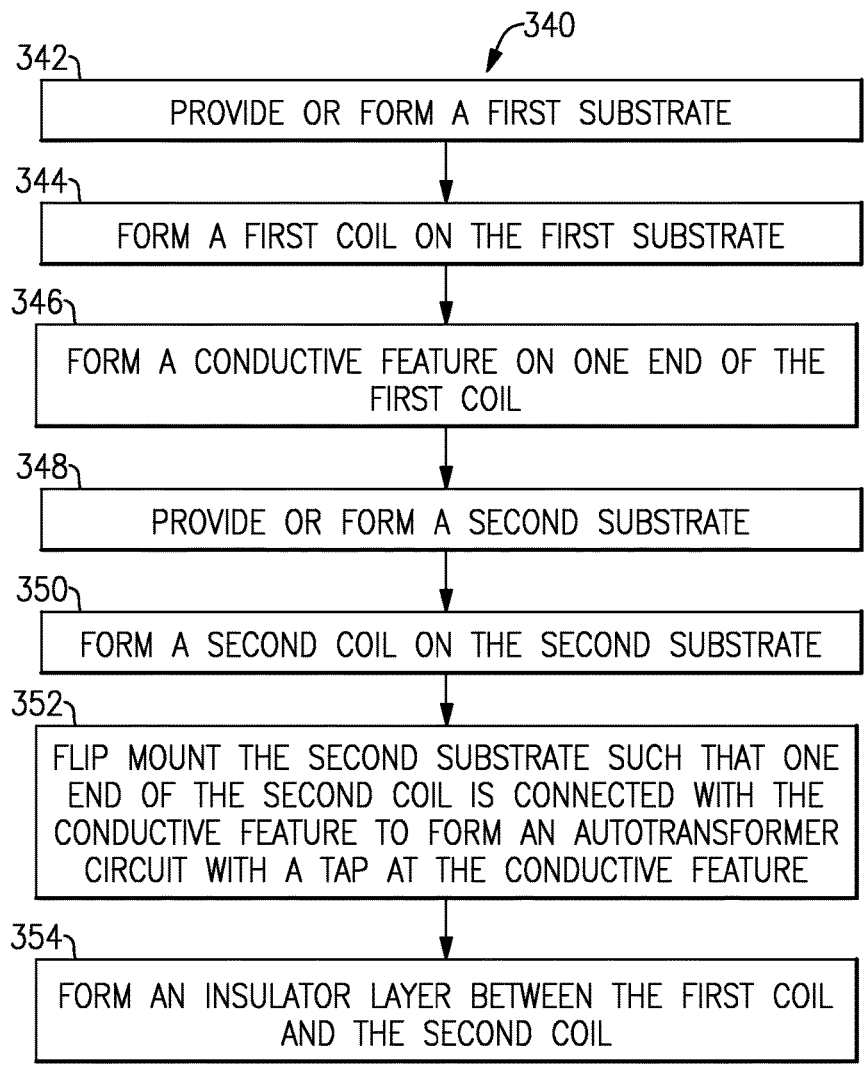
FIG. 21 shows a process that can be implemented to fabricate the example IPD of FIGS. 19 and 20.

FIG. 21 shows a process 340 that can be implemented to fabricate the IPD described in reference to FIGS. 19 and 20. In block 342, a first substrate can be provided or formed. In block 344, a first coil can be formed on the first substrate. In some embodiments, such a coil can be a conductive trace patterned on a surface of the substrate to form a spiral shaped coil. In block 346, a conductive feature can be formed on one end of the first coil.

In block 348, a second substrate can be provided or formed. In some embodiments, the second substrate may or may not be the same type as the first substrate. In block 350, a second coil can be formed on the second substrate. In some embodiments, such a coil can be a conductive trace patterned on a surface of the substrate to form a spiral shaped coil.

In block 352, the second substrate with the second coil thereon can be flip mounted on the first substrate such that one end of the second coil is connected with the conductive feature. Such a connection between the first and second coils can form an autotransformer with a tap at the conductive feature. In block 354, an insulator layer can be formed between the first coil and the second coil.

In some embodiments, the tap node can be electrically connected with, or be configured to accept an electrical connection with, an output of a power amplifier (PA). The other end of the second coil can be electrically connected with, or be configured to accept an electrical connection with, an output of a matching circuit that includes the autotransformer. In the various examples described in reference to FIGS. 16-21, conductive features can be implemented to provide and/or facilitate electrical connection(s) among the coils, as well as for input/output purpose. As described herein, one or more features of the present disclosure can also be implemented with other types of transformer configurations, including those where the coils are not electrically connected with each other. For such configurations, as well as other configurations involving other electrical connection configurations, conductive features can be implemented appropriately to facilitate electrical connections, including those for input/output purpose.

As described herein, such a matching circuit can include one or more components or circuits for providing matching on either or both sides of the autotransformer. Such components or circuits that are part of the IPD can be formed or provided to yield a desired impedance matching functionality for the IPD.

Figure 22:
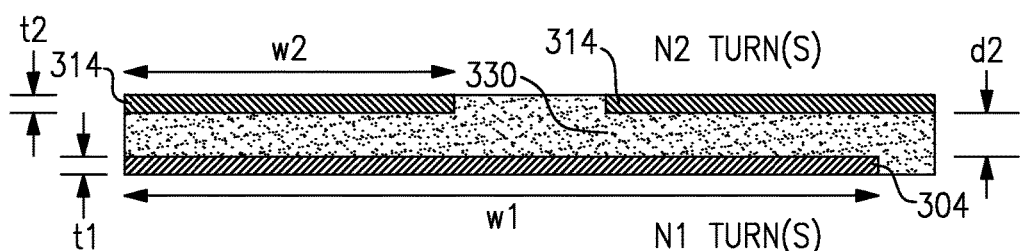
FIG. 22 shows examples of various design parameters associated with the example IPD of FIGS. 19-21.

An IPD described in reference to FIGS. 19-21 can yield an assembly of first and second coils 304, 314 in the form of traces depicted in a cross-sectional view of FIG. 22. The first coil 304 is depicted as a trace having sectional dimensions of w1 (width) and t1 (thickness). The second coil 314 is depicted as a trace having sectional dimensions of w2 (width) and t2 (thickness). The first and second coils 304, 314 are shown to be separated by a distance of d2, and such a gap is shown to be filled by an insulator material layer 330.

FIGS. 23-27 show examples of how some or all of the foregoing parameters can be considered to yield desirable properties of the autotransformers. For the examples described in reference to FIGS. 23-27, the insulator layer 330 is formed from dielectric material such as benzocyclobutene (BCB). Other dielectric materials such as polyimide, SiN (silicon nitride), SiO2 (silicon dioxide), etc. can also be utilized as the insulator layer 330. Further, it will be understood that other materials (e.g., polymer compounds) can also be used.

Figure 23A:
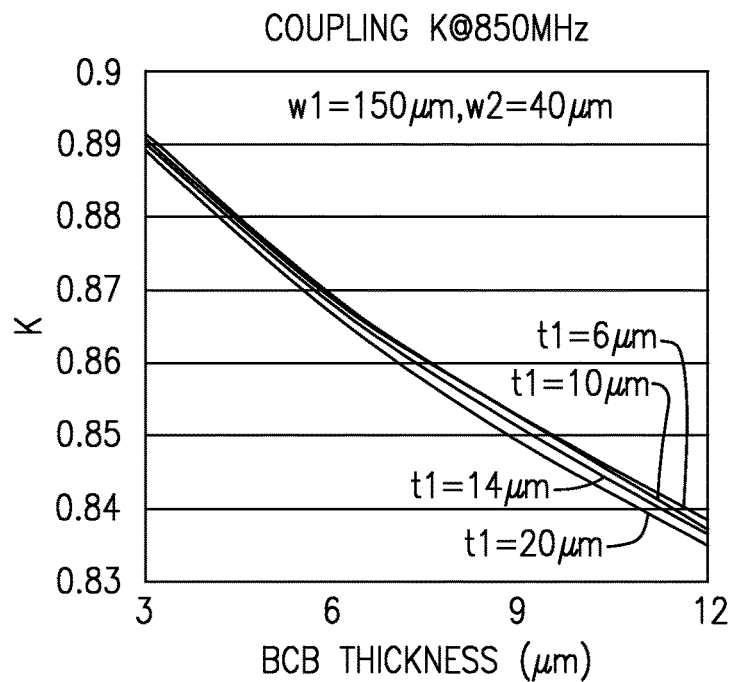
FIGS. 23A and 23B show examples of coupling coefficient K as a function of insulator thickness at two example frequencies for various primary coil thickness values.
Figure 23B:
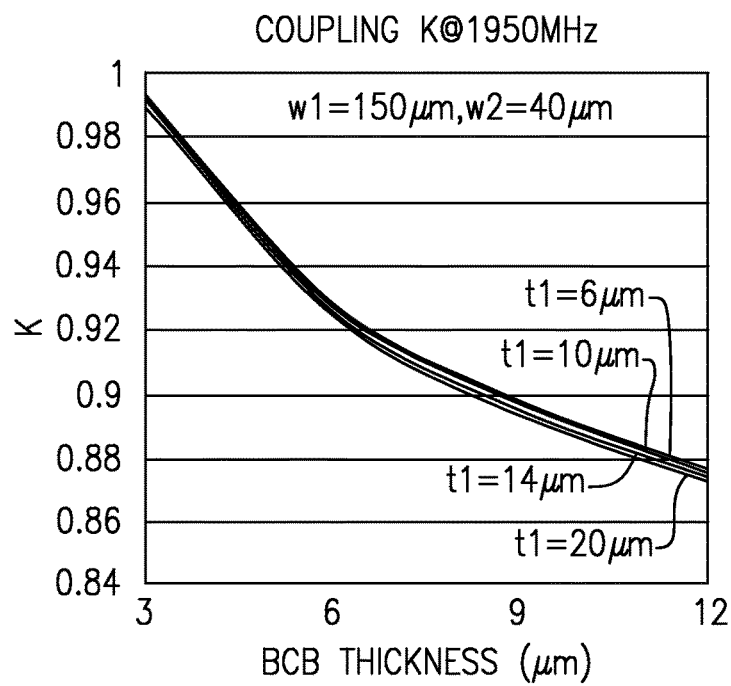

FIGS. 23A and 23B show an example of how metal thickness of a trace can be considered as a design factor. FIG. 23A shows plots of coupling coefficient (K) as a function of insulator (BCB) thickness (d2 in FIG. 22) for various thicknesses (t1=6, 10, 14, 20 μm) of the primary trace (304), at a frequency of 850 MHz, and with the primary and secondary trace widths (w1, w2) at 150 mμ and 40 μm, respectively. FIG. 23B shows the same plots, but at a frequency of 1,950 MHz.

In the example of FIGS. 23A and 23B, it is noted that the coupling coefficient K decreases monotonically with an increase in BCB thickness, as generally expected. Among the different values of the primary trace thickness (t1), the thinner primary traces appear to have slightly higher coupling effects than the thicker ones.

Figure 24:
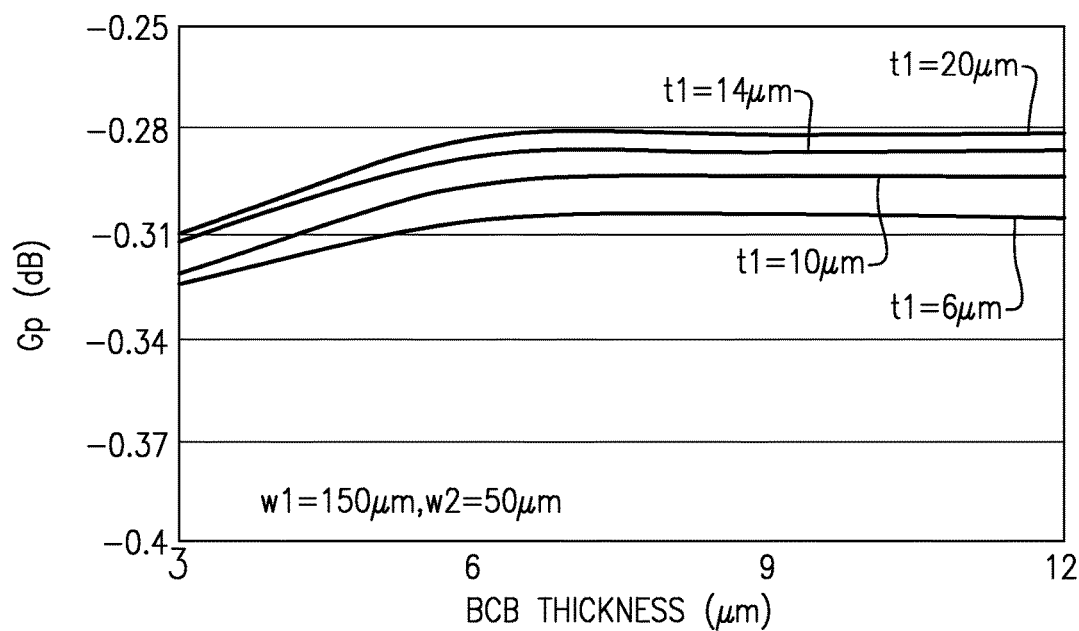
FIG. 24 shows examples of insertion loss as a function of insulator thickness for various primary coil thickness values.

FIG. 24 shows plots of insertion loss as a function of insulator (BCB) thickness (d2 in FIG. 22) for various primary trace thicknesses (t1=6, 10, 14, 20 μm), for a primary trace width w1 of 150 μm and a secondary trace width w2 of 50 μm), at a frequency of 1,950 MHz. It is noted that thicker primary traces in general yield lower magnitude of loss.

Figure 25:
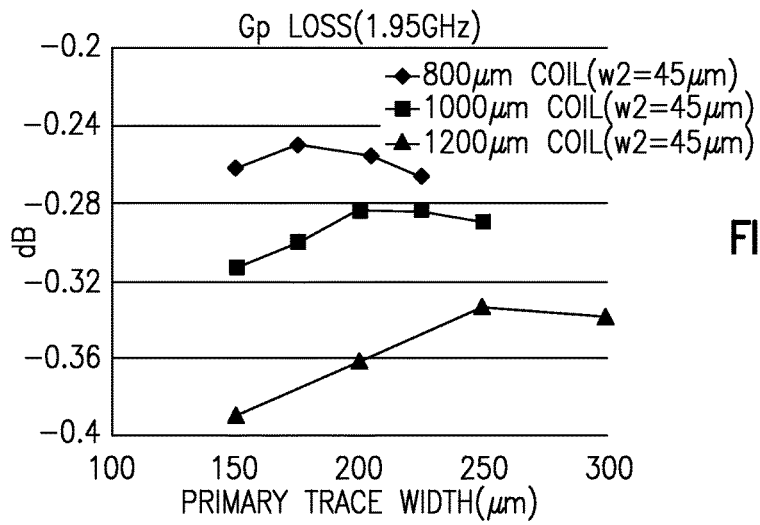
FIG. 25 shows an example of how overall coil size can be designed.

FIG. 25 shows plots of insertion loss as a function of primary trace width (w1 in FIG. 22) for various overall coil sizes (800, 1000, 1200 μm) with a fixed secondary trace width (w2=45 μm), at a frequency of 1,950 MHz. For these plots, the following parameters are fixed as follows: turn ratio of (N2:N1=3.75:1), t1=6 μm, t2=6 μm, and d2 (BCB) =6 μm. Such examples can be utilized to facilitate selection of design parameters such as overall coil size.

Figure 26:
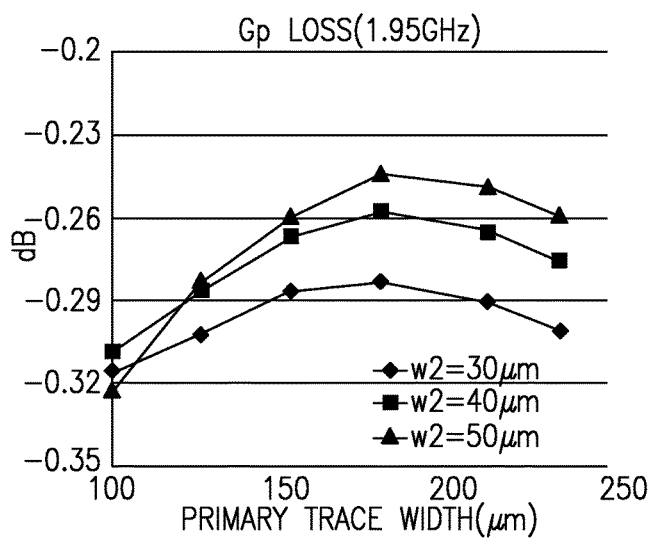
FIG. 26 shows an example of how trace width of a coil can be designed.

FIG. 26 shows plots of insertion loss as a function of primary trace width (w1 in FIG. 22) for various secondary trace widths (30, 40, 50 μm), at a frequency of 1,950 MHz. For these plots, the following parameters are fixed as follows: overall coil size=800 μm, turn ratio of (N2:N1=3.75: 1), t1=6 μm, t2=6 μm, and d2 (BCB)=6 μm. It is noted that wider second trace widths generally have lower loss magnitude. However, when the primary trace width is small, such wider second trace widths seem to yield higher loss magnitudes. It is also noted that for a given second trace width, there is typically a minimum loss magnitude in the primary trace width.

Figure 27:
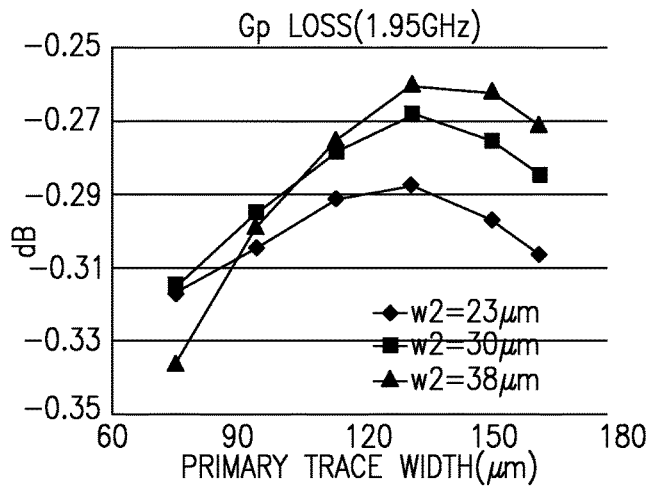
FIG. 27 shows another example of how trace width of a coil can be designed.

FIG. 27 shows plots of insertion loss as a function of primary trace width (w1 in FIG. 22) for various secondary trace widths (23, 30, 38 µm), at a frequency of 1,950 MHz. For these plots, the following parameters are fixed as follows: overall coil size=600 µm, turn ratio of (N2:N1=3.75: 1), t1=6 µm, t2=6 µm, and d2 (BCB)=6 µm. Similar to the 800 µm coil size example of FIG. 26, it is noted that wider second trace widths generally have lower loss magnitude. However, when the primary trace width is small, such wider second trace widths seem to yield higher loss magnitudes. It is also noted that for a given second trace width, there is typically a minimum loss magnitude in the primary trace width.

FIGS. 28-40 show various examples of how IPDs as described herein can provide advantageous features at different levels of applications.

Figure 28:
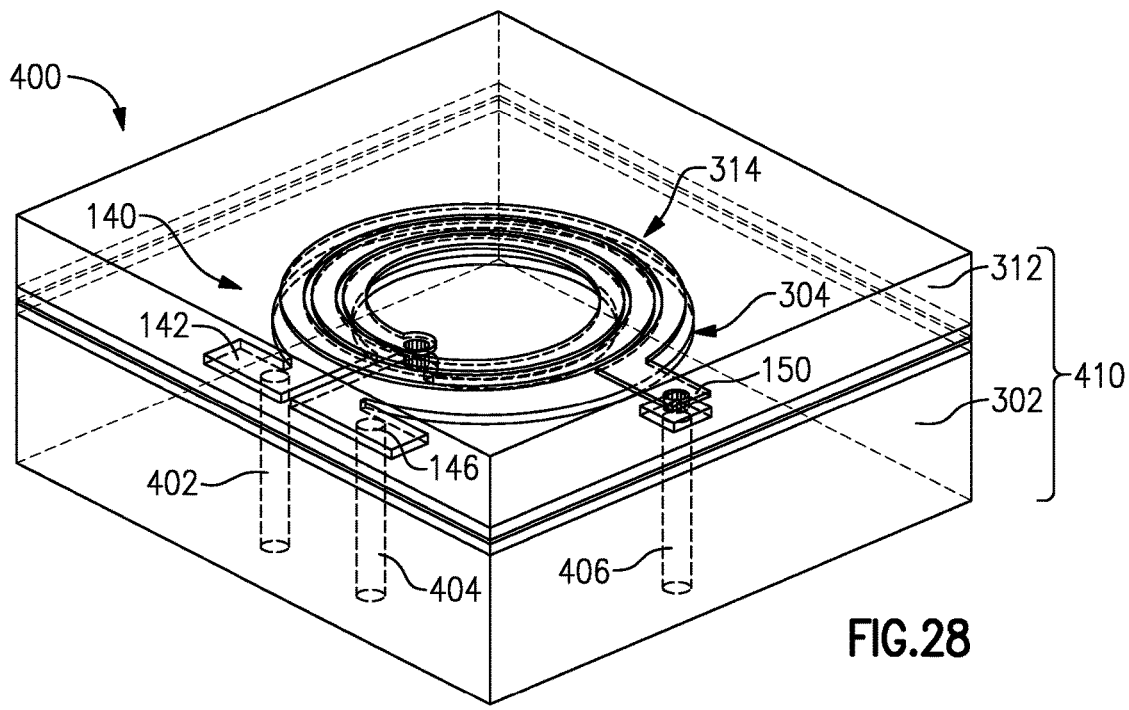
FIG. 28 shows that in some embodiments, an autotransformer-based matching circuit implemented as an IPD can be configured to provide a surface for mounting one or more components thereon.

FIG. 28 shows an IPD 400 that is similar to the example described in reference to FIGS. 19 and 20. The IPD 400 is shown to include an autotransformer 140 having primary and secondary coils (e.g., traces) 304, 314 that are spaced apart by, for example, an insulator layer such as a BCB layer. Such an autotransformer can have its end nodes 142, 150, as well as a tap node 146 implemented as described herein. Further, such an autotransformer can be formed by flip-mounting of one assembly (having a coil on a substrate) on another assembly (having a coil on a substrate).

The resulting IPD 400 is shown to define a body 410 that can include the first and second substrates 302, 312 associated with the primary and secondary coils 304, 314. Such a body is shown to include a first surface defined by a surface of the first substrate 302 opposite from the surface on which the primary coil 304 is implemented, and a second surface defined by a surface of the second substrate 312 opposite from the surface on which the secondary coil 314 is implemented. When oriented in the example manner as shown in FIG. 28, the first surface of the body 410 can be a lower surface for mounting to, for example, a packaging substrate of a module. The second surface of the body 410 can be an upper surface that is substantially flat and suitable for mounting of one or more components thereon. Examples of such mounting of component(s) on the IPD 400, as well as associated advantages, are described herein in greater detail.

FIG. 28 further shows that in some embodiments, appropriate connections can be implemented in the IPD 400 to provide electrical connections between the autotransformer 140 and contact locations on the lower surface of the body 410. Such connections can allow the IPD 400 to be mounted on another substrate, and also leave its upper surface suitable for mounting of one or more components. For example, conductive vias 402, 404, 406 through the first substrate 302 are shown to electrically connect the nodes 142, 146, 150 of the autotransformer 140 with their respective contact locations on the lower surface of the body 410. Although such connections are depicted as direct through-substrate vias, it will be understood that other connection configurations (e.g., through intermediate metal layer(s), offset vias, etc.) can also be implemented.

Figure 29:
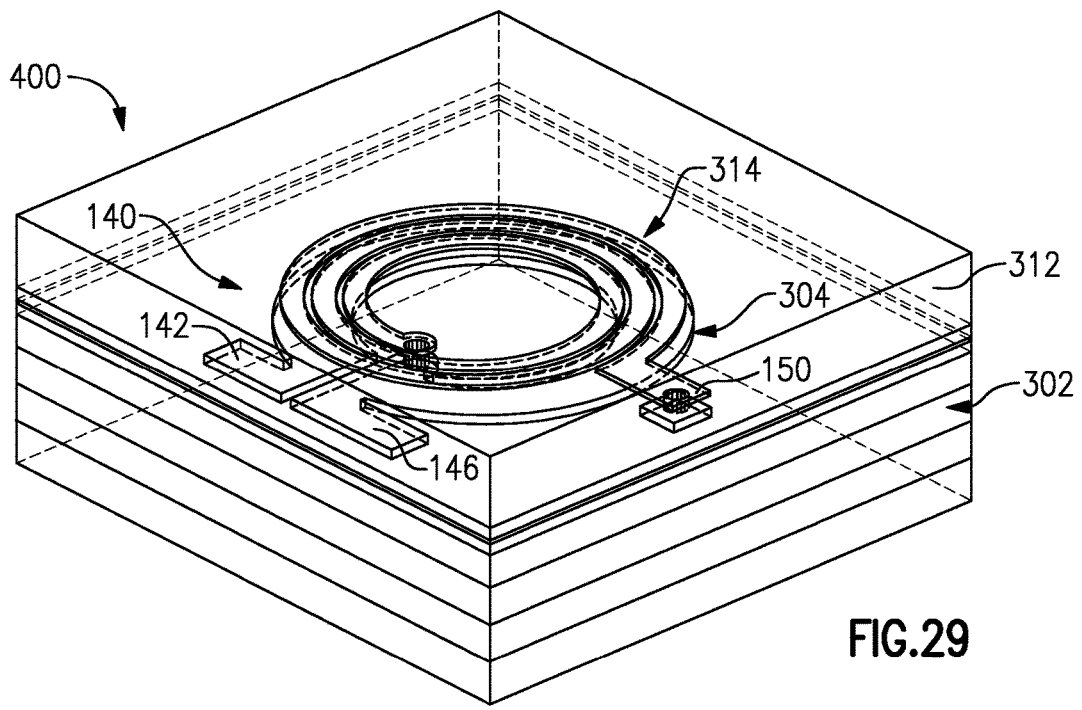
FIG. 29 shows another example of an autotransformer-based matching circuit implemented as an IPD so as to provide a surface for mounting one or more components thereon.

FIG. 29 shows another example of an IPD 400 that is similar to the example described in reference to FIGS. 19 and 20. The IPD 400 is shown to include an autotransformer 140 having primary and secondary coils (e.g., traces) 304, 314 that are spaced apart by, for example, an insulator layer such as a BCB layer. Such an autotransformer can have its end nodes 142, 150, as well as a tap node 146 implemented as described herein. Further, such an autotransformer can be formed by flip-mounting of one assembly (having a coil on a substrate) on another assembly (having a coil on a substrate).

In the example of FIG. 29, the first substrate 302 can be a packaging substrate such as a laminate substrate, and the second substrate 312 can be a die substrate. Configured in the foregoing manner, the coils of the autotransformer 140 can be positioned above the surface of the laminate substrate 302. Such a configuration can allow the laminate substrate to have a reduced number of layers. Additionally, the die substrate with the secondary coil being flip-mounted over the primary coil can allow the backside of the die substrate to provide an upper surface that is substantially flat and suitable for mounting of one or more components thereon. Examples of such mounting of component(s) on the IPD 400, as well as associated advantages, are described herein in greater detail.

Figure 30:
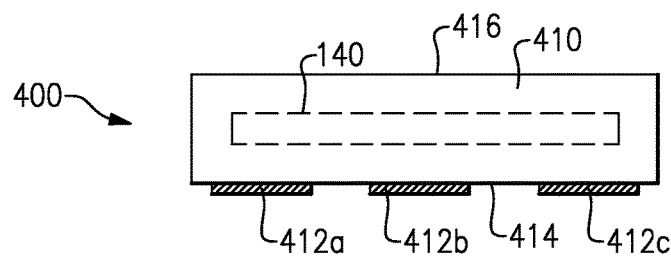
FIG. 30 shows an example IPD having one autotransformer configured in a manner similar to the example of FIG. 28.

FIG. 30 depicts a side view of an IPD 400 similar to the example of FIG. 28, with the autotransformer collectively indicated as 140. The body 410 is shown to define a first surface 414 (e.g., a lower surface) on which contact pads 412 are formed so as to facilitate mounting of the IPD 400 on another substrate. Such contact pads can be electrically connected to the autotransformer 140 as described herein. The body 410 is shown to further define a second surface 416 (e.g., an upper surface). As described herein, such a surface can be suitable for mounting of one or more components.

Figure 31:
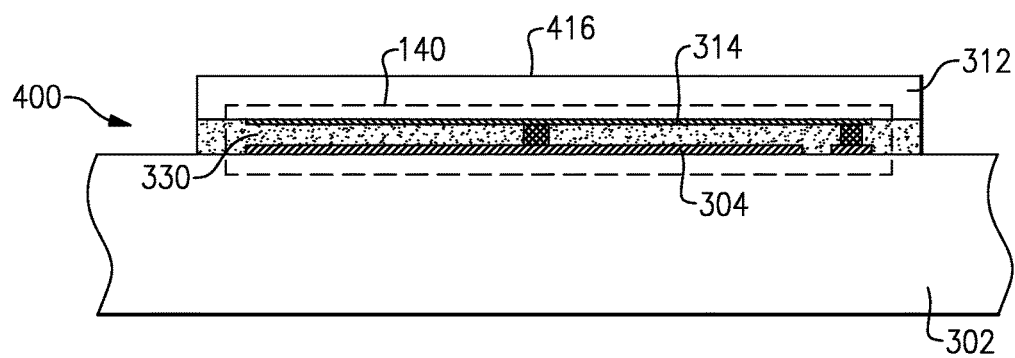
FIG. 31 shows an example IPD having one autotransformer configured in a manner similar to the example of FIG. 29.

FIG. 31 shows a side view of an IPD 400 similar to the example of FIG. 29, with the autotransformer collectively indicated as 140. The IPD 400 is shown to include a primary coil 304 formed on the surface of a packaging substrate 302 such as a laminate substrate. A die substrate 312 with a secondary coil 314 formed thereon is shown to be flip-mounted over the primary coil, with one or more connection features between the coils 304, 314. An insulator layer 330 is shown to generally fill the space between the coils 304, 314 to provide, for example, desirable autotransformer properties and support of the die substrate 312. The die substrate 312 mounted in the foregoing manner is shown to define a surface 416 (e.g., an upper surface). As described herein, such a surface can be suitable for mounting of one or more components.

Figure 32:
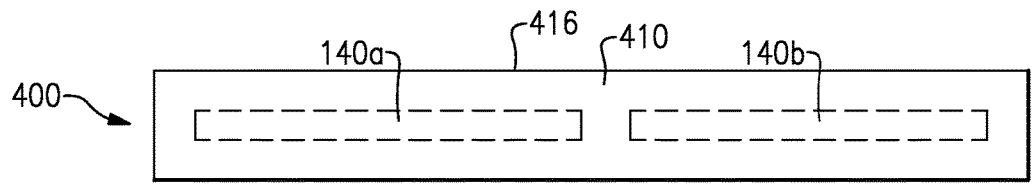
FIG. 32 shows that in some embodiments, an IPD can include more than one autotransformer.

Some of the examples of IPDs are described herein as having one autotransformer. FIG. 32 shows that in some embodiments, more than one autotransformer can be implemented in a given IPD. For example, FIG. 32 depicts a side view of an IPD 400, with two autotransformers 140a, 140b. Such two autotransformers can be fabricated by, for example, arranging two primary traces on a common first substrate, arranging two secondary traces on a common second substrate, and flip-mounting one substrate on the other substrate as described herein.

In the example of FIG. 32, the IPD 400 is shown to define a second surface 416 (e.g., an upper surface). In some embodiments, such an upper surface can be larger than the upper surface of the examples of FIGS. 30 and 31, thereby providing a larger surface for mounting of one or more components.

It will be understood that various IPDs described herein may or may not include other circuit elements. Such circuit elements can include those used to provide matching functionality on either or both of the input and output sides of autotransformers.

FIGS. 33-39 show examples where one or more components are mounted on an IPD having one or more features as described herein. In some RF applications, it can be desirable to have a band selection switch be relatively close to an output matching network (OMN) associated with a power amplifier (PA). Such OMNs are generally described herein in the context of matching circuits. In some embodiments, such a band selection switch can be stacked over an OMN that is implemented as an IPD to provide such proximity, as well as to reduce the overall lateral area of a module.

Figure 33:
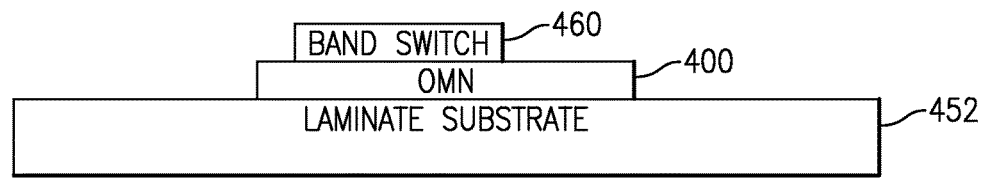
FIG. 33 shows an example configuration where another component is mounted on the surface of an IPD similar to the examples of FIGS. 28-32.
Figure 34A:
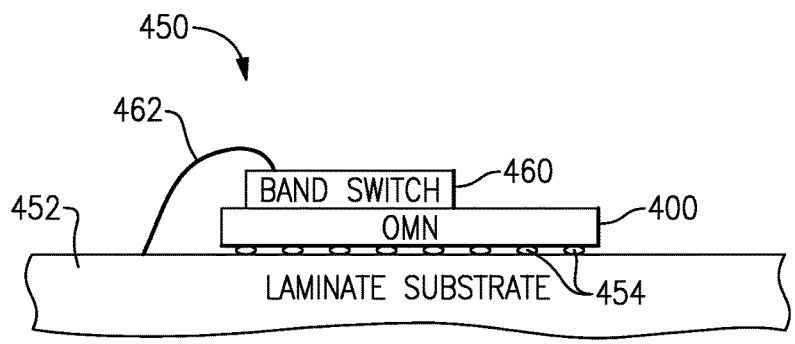
FIGS. 34A and 34B show side and plan views of connections that can be implemented for the stacked configuration of FIG. 33.
Figure 34B:
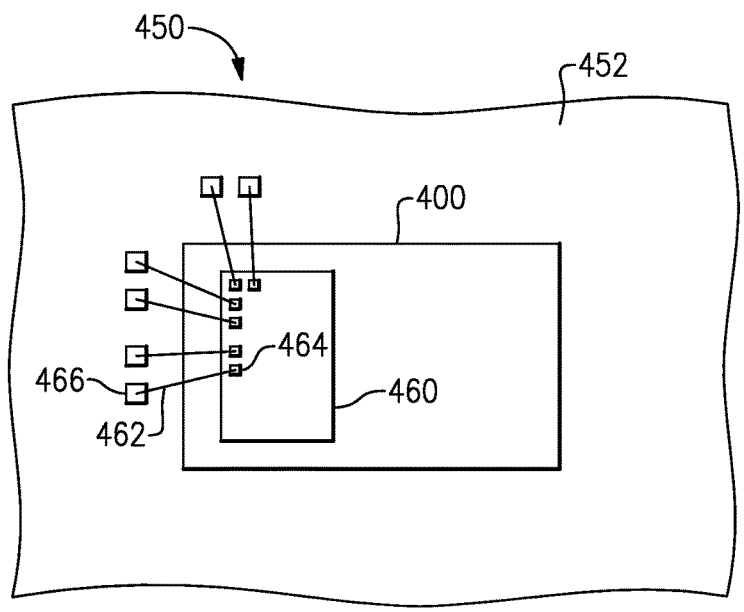

FIG. 33 shows that an OMN implemented as an IPD 400 can be mounted on a packaging substrate such as a laminate substrate 452, and a band selection switch 460 can be stacked over the OMN IPD 400. FIGS. 34A and 34B show side and plan views of an example configuration for the foregoing stack of the OMN IPD 400 and the band selection switch 460, as well as electrical connections that can be formed to facilitate various operations.

In FIG. 33, the OMN IPD 400 is shown to be mounted on the laminate packaging substrate 452. The band selection switch 460 is shown to be mounted on the OMN IPD 450. The OMN IPD 400 can be configured in a number of ways, including, for example, flip-chip configuration where electrical connections are generally made through bump solders. Although described in the context of such a flip-chip configuration, it will be understood that one or more features of the present disclosure can also be implemented in other configurations for the OMN IPD 400. The band selection switch 460 can be configured in a number of ways, including, for example, as a die with wirebonding configuration where electrical connections are generally made through wirebonds. Although described in the context of such a wirebonding configuration, it will be understood that one or more features of the present disclosure can also be implemented in other die configurations for the band selection switch 460.

FIGS. 34A and 34B show side and plan views of an example configuration 450 where connections among the band selection switch 460, the OMN IPD 400, and the laminate substrate 452 are implemented as flip-chip connections and wirebonds. For example, and as depicted in a simplified view of FIG. 34A, wirebonds 462 can be formed between the band selection switch 460 and the laminate substrate 452 to provide various electrical connections. For example, the foregoing wirebond connections can be formed between contact pads 464 formed on the band selection switch die 460 and contact pads 466 formed on the laminate substrate 452. Electrical connections and mechanical mounting functionality between the OMN IPD 400 and the laminate substrate 452 can be provided by bump solders 454.

In the example of FIGS. 33 and 34, the OMN being implemented as an IPD as described herein allows mounting of a component such as a band selection switch. As also described herein, such a configuration provides advantages, including reduced space occupied by such components, as well as providing close proximity between the OMN and the band selection switch.

As described herein, the flip-chip or flip-mounted configuration of the OMN IPD 400 can provide a relatively large platform for stacking, for example a band switch die thereon. In some embodiments, there may be sufficient space on such an OMN IPD to stack another device aside from the band switch die.

Figure 35A:
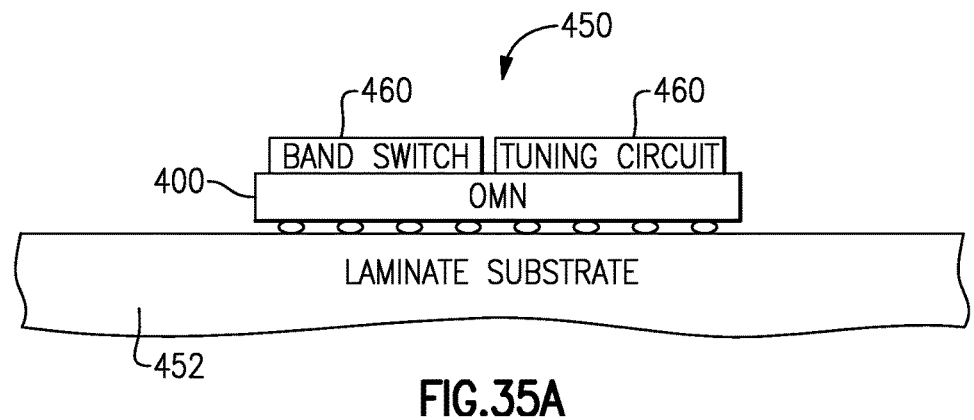
FIGS. 35A and 35B show side and plan views of an example configuration where two components are mounted on the surface of an IPD similar to the examples of FIGS. 28-32.
Figure 35B:
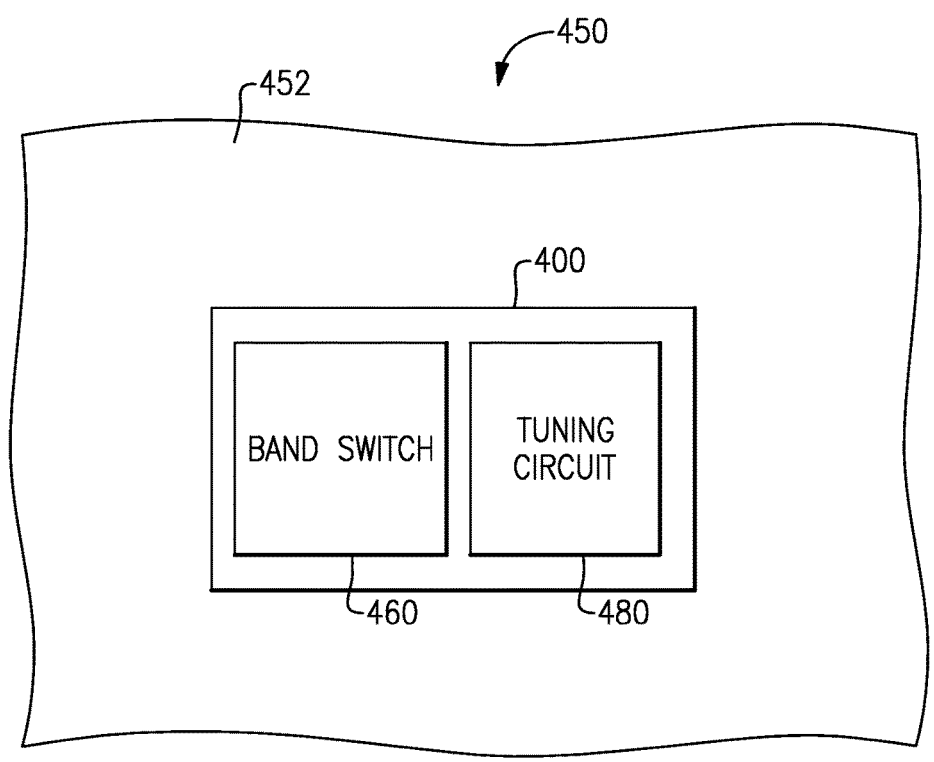

FIGS. 35A and 35B show side and plan views of an example configuration 450 where a band switch 460 is mounted on an OMN IPD 400, and an additional device is also mounted on the OMN IPD 400. In some embodiments, such an additional device can include, for example, a tuning circuit 480. Such a tuning circuit can include, for example, harmonic tanks, and be implemented as a duplexer-tuning IPD. Positioning such an IPD above the OMN device provides additional space saving on the laminate substrate 452.

Figure 36:
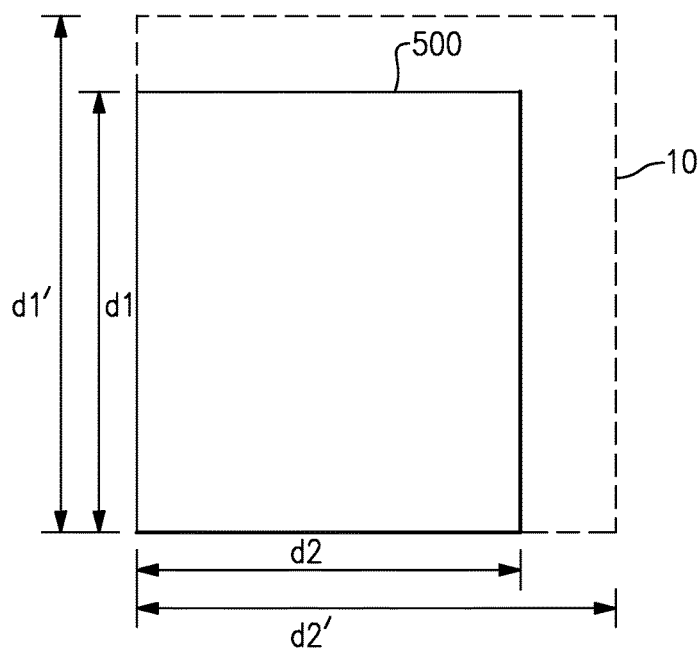
FIG. 36 shows an example of how the size of a module having one or more features as described herein can be reduced.

FIG. 36 shows an example of reduction in the lateral dimensions of a module that can result from space savings provided by stacking of component(s) as described herein. A module 500 having one or more features as described herein is compared to a module 10 without such features. The module 10 is shown to have lateral dimensions of d1'×d2'; while the module 500 is shown to have reduced dimensions of d1×d2. For example, a multimode, multiband (MMMB) PA module without the stacking features as described herein can have lateral dimensions of approximately 5 mm×7 mm. A PA module implemented using one or more stacking features as described herein can have lateral dimensions of approximately 4 mm×7 mm, which is an approximately 20% reduction in lateral size.

Figure 37:
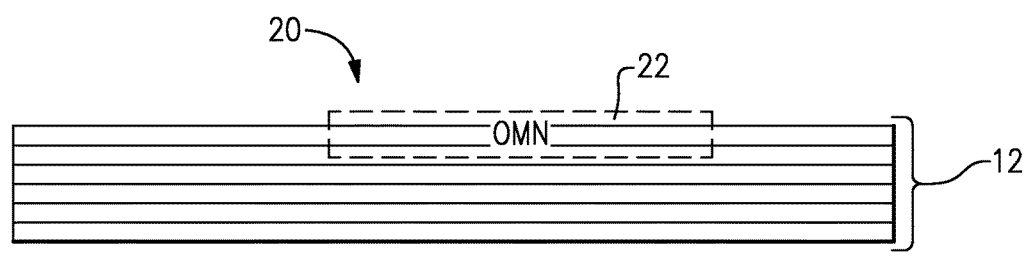
FIGS. 37 and 38 show examples of how a module having one or more features as described herein can allow use of a laminate substrate having a reduced number of laminate layers.
Figure 38:
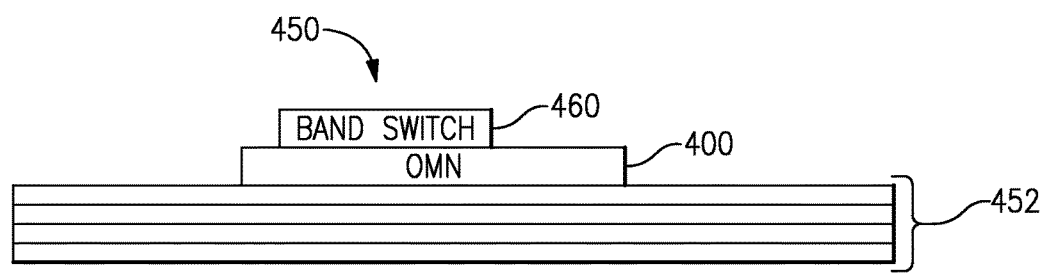

FIGS. 37 and 38 show another advantageous feature that can result in modules having one or more features as described herein. FIG. 37 shows an example configuration 20 without such features, and FIG. 38 shows an example configuration 450 with such features. More particularly, FIG. 37 shows a laminate substrate 12 having, for example six laminate layers. As is generally understood, some or all of matching network circuits can be implemented in one or more of such laminate layers. Accordingly, an example output matching network (OMN) 22 is depicted as being part of the laminate substrate 12.

In FIG. 38, an OMN IPD 400 can be implemented on a laminate substrate 452. Because such an OMN IPD can include some or all of the components and/or functionalities associated with the in-substrate portion of the OMN 22 (FIG. 37), amount of lateral space and/or layers in the laminate substrate can be reduced. For example, the laminate substrate 12 in the example of FIG. 37 includes six layers; while the laminate substrate 452 in the example of FIG. 38 includes four layers. Such a significant reduction in the number of laminate layers can provide a number of advantages, including, reduction in height of the module and reduction in costs associated with the module (e.g., cost associated with the laminate substrate).

Figure 39:
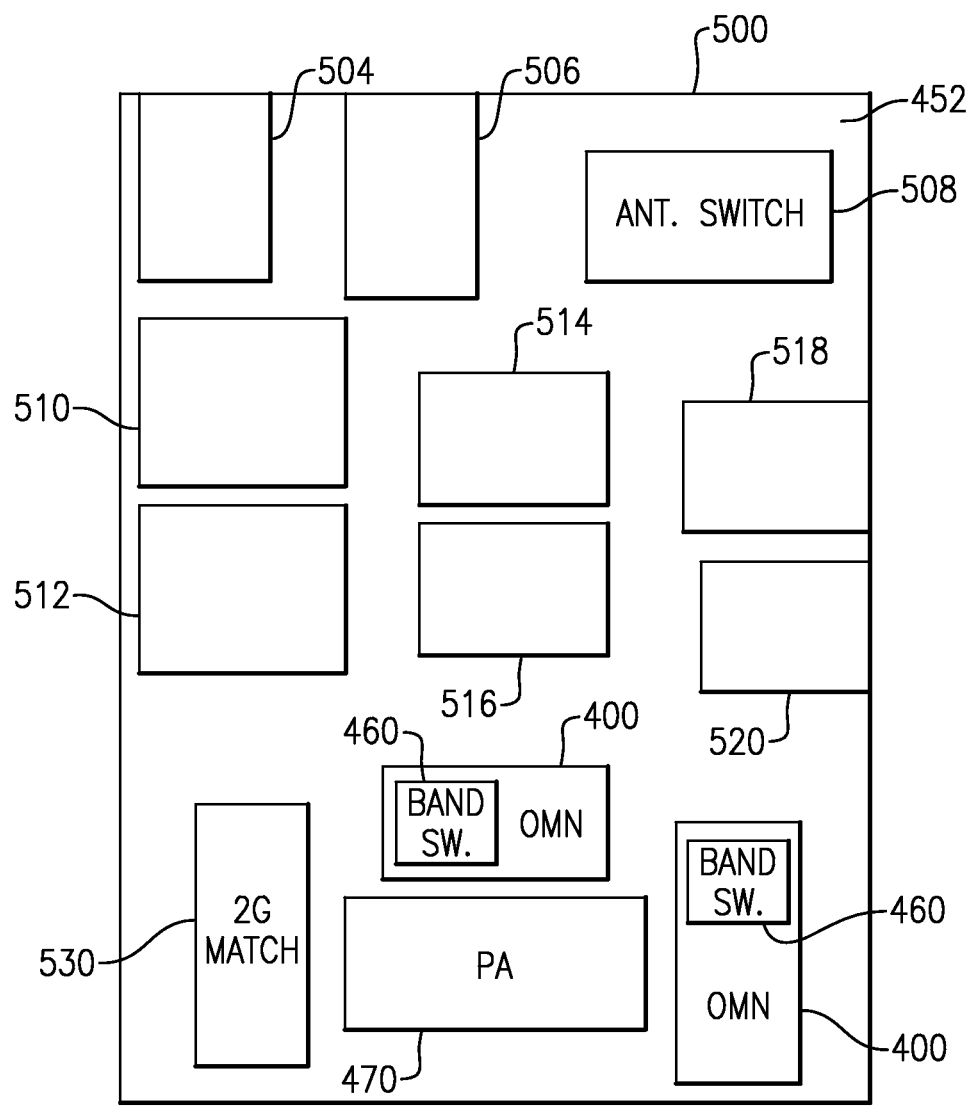
FIG. 39 shows an example of a module that can benefit from one or more features as described herein.

FIG. 39 depicts a block diagram of a module 500 that includes one or more features as described herein. Such a module can be configured to facilitate transmission and/or reception of RF signals. The module 500 is shown to include a packaging substrate 452 configured to receive a plurality of components. Such a packaging substrate can include, for example, a laminate substrate.

The module 500 is shown to include a PA die 470 such as a gallium arsenide (GaAs) die implemented in a heterojunction bipolar transistor (HBT) process technology. Although described in the context of HBT PAs, it will be understood that one or more features of the present disclosure can also be implemented in other types of PA die.

The module 500 is shown to further include a plurality of output matching network (OMN) IPDs 400. As described herein, a band switch circuit can be implemented and stacked over each of the OMN IPDs 400. For example, a switch circuit die 460 is shown to be stacked over each of the two OMN IPDs 400. In some embodiments, the OMN IPDs 400 can be configured to provide matching functionality for 3G/4G bands.

In some embodiments, the module 500 can further includes a matching network device 530 for 2G bands.

In FIG. 39, a plurality of filter devices and a plurality of duplexer devices are also shown to be mounted on the packaging substrate 452. For example, band-pass filters and/or duplexers indicated as blocks 504, 506, 510, 512, 516, 516, 518 and 520 are shown to be mounted on the packaging substrate 452.

In some implementations, a device having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 40:
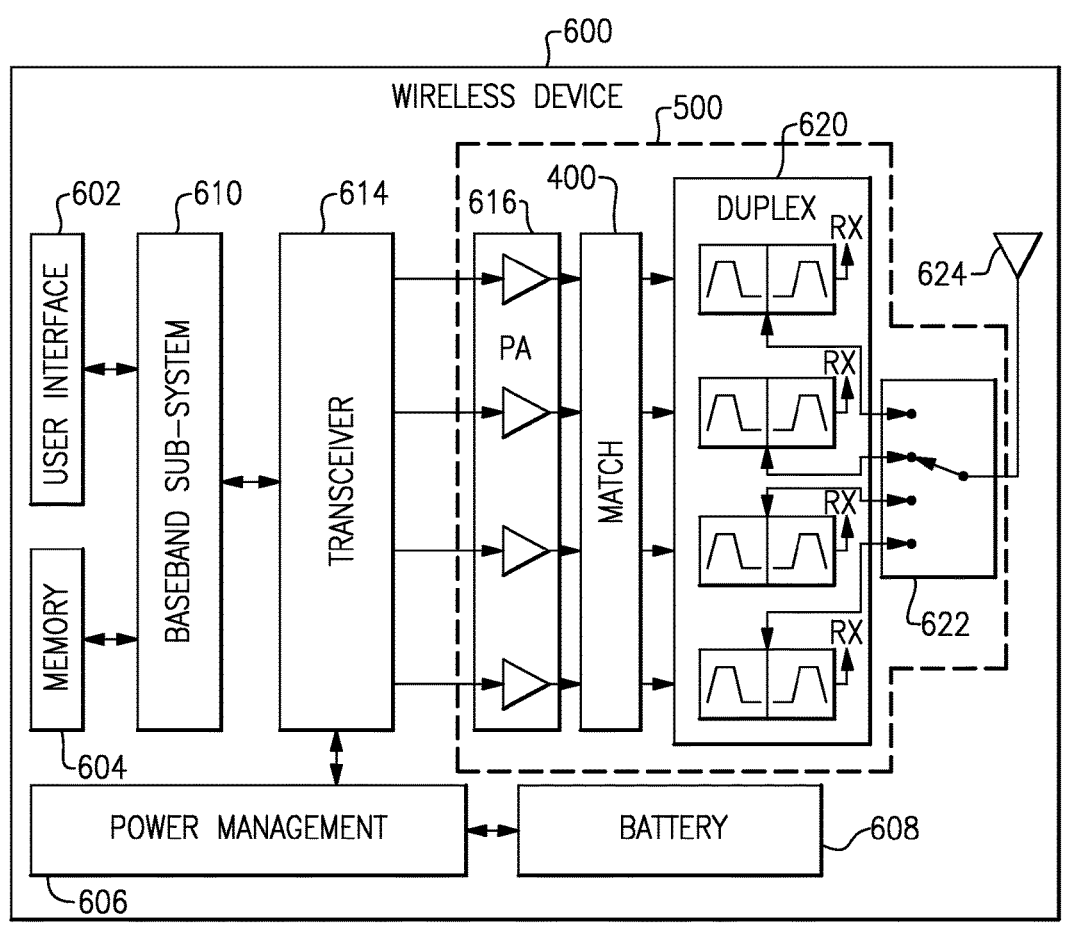
FIG. 40 shows an example of a wireless device that can benefit from one or more features as described herein.

FIG. 40 depicts an example wireless device 600 having one or more advantageous features described herein. In the context of a matching circuit 400 having one or more features as described herein, such a circuit (e.g., in a die form, an IPD form, modular form, or some combination thereof) can be provided, for example, to impedance match the outputs of a power amplifier (PA) module 616 having one or more PAs.

In the example wireless device 600, the PA module 614 can provide an amplified RF signal to a switch 622 (via the matching circuit 400 and a duplexer 620), and the switch 622 can route the amplified RF signal to an antenna 624. The PA module 616 can receive an unamplified RF signal from a transceiver 614 that can be configured and operated in known manners.

The transceiver 614 can also be configured to process received signals. Such received signals can be routed to one or more LNAs (not shown) from the antenna 624, through the duplexer 620.

The transceiver 614 is shown to interact with a baseband sub-system 610 that is configured to provide conversion between data and/or voice signals suitable for a user and RF signals suitable for the transceiver 614. The transceiver 614 is also shown to be connected to a power management component 606 that is configured to manage power for the operation of the wireless device 600.

The baseband sub-system 610 is shown to be connected to a user interface 602 to facilitate various input and output of voice and/or data provided to and received from the user. The baseband sub-system 610 can also be connected to a memory 604 that is configured to store data and/or instructions to facilitate the operation of the wireless device, and/or to provide storage of information for the user.

In some embodiments, one or more features of the present disclosure can be implemented in a front-end module (FEM) 500. Such a module can have different components depending on designs. For example, the FEM 500 can include the PAs 614, the matching circuit 400, the duplexers 620, and the switch 622. It will be understood that greater or lesser number of components can be included in such a FEM.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Described herein are examples of how primary and secondary metal traces can be implemented on an IPD, or on a packaging substrate and an IPD die substrate. An autotransformer is an example of how such primary and secondary metal traces can be configured to provide a number of advantageous features. Although the various examples herein are described in such an autotransformer context, it will be understood that one or more features associated with the primary and secondary metal traces can also be implemented in other applications. For example, first and second metal traces as described herein can also be implemented as a general transformer, where the primary and secondary coils are spaced from each other and not connected electrically. In such a context, additional functionalities can be implemented. For example, a tap connection can be provided on either of the primary and secondary coils to sense a current flowing through the tapped coil. Such a configuration can be utilized as, for example, a monitor for power or current of an output of a device such as a PA.

Further, it will be understood that while various examples of the autotransformer-based matching circuits are described in the context of IPDs, one or more active components or circuits can also be incorporated into or be combined with such matching circuits. Thus, one or more features of the present disclosure are not necessarily limited to IPDs.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An impedance matching device for a radio-frequency (RF) power amplifier (PA), the device comprising:
   a primary metal trace having one or more turns between a first end and a second end, the first end of the primary metal trace configured to be capable of being connected to a voltage source for the PA, the second end of the primary metal trace configured to be capable of being connected to an output of the PA;
   a secondary metal trace having one or more turns between a first end and a second end, the first end of the secondary metal trace connected to the second end of the primary metal trace, the second end of the secondary metal trace configured to be capable of being connected to an output node, the primary metal trace and the secondary metal trace being in respective planes separated by a distance and being in an autotransformer configuration; and
   a capacitance implemented between the first and second ends of the first metal trace to be electrically parallel with the first metal trace, the capacitance configured to substantially resonate out magnetizing inductance of the autotransformer.

2. The impedance matching device of claim 1 further comprising a first substrate configured to support the primary metal trace.

3. The impedance matching device of claim 1 further comprising an insulator layer implemented between the primary metal trace and the secondary metal trace, the insulator layer having a thickness selected to provide the separation distance.

4. The impedance matching device of claim 3 further comprising a conductive feature implemented through the insulator layer, the conductive feature configured to provide the connection between the first end of the secondary metal trace and the second end of the primary metal trace.

5. The impedance matching device of claim 2 further comprising a second substrate configured to support the secondary metal trace.

6. The impedance matching device of claim 1 wherein the impedance matching device is an integrated passive device (IPD).

7. The impedance matching device of claim 1 wherein the primary metal trace is wider than the secondary metal trace.

8. The impedance matching device of claim 1 wherein the primary metal trace is thicker than the secondary metal trace.

9. The impedance matching device of claim 8 wherein the primary metal trace is configured to provide passage of a DC current for the PA.

10. The impedance matching device of claim 9 wherein the primary metal trace is further configured to provide a low impedance path for an RF current.

11. The impedance matching device of claim 8 wherein the secondary metal trace and its separation distance with the primary metal trace are configured to provide strong coupling between the primary and secondary metal traces.

12. The impedance matching device of claim 1 further comprising one or more circuit elements configured to provide matching functionality on either or both sides of the autotransformer.

13. A method for fabricating an impedance matching device, the method comprising:
   forming a primary metal trace, the primary metal trace having one or more turns between a first end and a second end, the first end of the primary metal trace configured to be capable of being connected to a voltage source for a power amplifier (PA), the second end of the primary metal trace configured to be capable of being connected to an output of the PA;
   implementing a secondary metal trace relative to the primary metal trace, the secondary metal trace having one or more turns between a first end and a second end, the first end of the secondary metal trace connected to the second end of the primary metal trace, the second end of the secondary metal trace configured to be capable of being connected to an output node, the primary metal trace and the secondary metal trace being in respective planes separated by a distance and being in an autotransformer configuration; and
   connecting a capacitance between the first and second ends of the first metal trace to be electrically parallel with the first metal trace, the capacitance configured to substantially resonate out magnetizing inductance of the autotransformer.

14. A radio-frequency (RF) module comprising:
   a packaging substrate configured to receive a plurality of components;
   a power amplifier (PA) die implemented on the packaging substrate, the PA die including an output node configured to provide an amplified RF signal; and
   an impedance matching device implemented on the packaging substrate, the impedance matching device including a primary metal trace having one or more turns between a first end and a second end, the first end of the primary metal trace connected to a voltage source for the PA die, the second end of the primary metal trace connected to the output node of the PA die, the impedance matching device further including a secondary metal trace having one or more turns between a first end and a second end, the first end of the secondary metal trace connected to the second end of the primary metal trace, the second end of the secondary metal trace connected to an output node of the impedance matching device, the primary metal trace and the secondary metal trace being in respective planes separated by a distance and being in an autotransformer configuration, the impedance matching device further including a capacitance implemented between the first and second ends of the first metal trace to be electrically parallel with the first metal trace, the capacitance configured to substantially resonate out magnetizing inductance of the autotransformer.

15. The RF module of claim 14 wherein the impedance matching device is implemented as an integrated passive device (IPD).

16. The RF module of claim 15 wherein the IPD includes a substantially flat surface suitable for mounting of a component.

17. The RF module of claim 15 wherein the packaging substrate includes a laminate substrate.

18. The RF module of claim 17 wherein the IPD having the first and second metal traces allows the laminate substrate to have a reduced number of layers.

19. The RF module of claim 15 wherein the RF module is a front-end module (FEM).

* * * * *